(12) United States Patent
Bobok et al.

(10) Patent No.: US 7,552,043 B2
(45) Date of Patent: Jun. 23, 2009

(54) METHOD, SYSTEM AND PROGRAM PRODUCT FOR SELECTIVELY REMOVING INSTRUMENTATION LOGIC FROM A SIMULATION MODEL

(75) Inventors: Gabor Bobok, Niskayuna, NY (US); Wolfgang Roesner, Austin, TX (US); Matyas A. Sustik, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 11/226,969

(22) Filed: Sep. 15, 2005

(65) Prior Publication Data

US 2007/0061121 A1    Mar. 15, 2007

(51) Int. Cl.
- *G06F 17/50* (2006.01)
- *G06F 9/45* (2006.01)
- *G06F 9/455* (2006.01)
- *G06G 7/62* (2006.01)

(52) U.S. Cl. .............................. 703/16; 703/13; 703/14; 703/15

(58) Field of Classification Search .............. 703/13–17
See application file for complete search history.

(56) References Cited

U.S. PATENT DOCUMENTS

| | | | |
|---|---|---|---|
| 5,212,650 A | 5/1993 | Hooper et al. | |
| 5,369,763 A | 11/1994 | Biles | |
| 5,604,895 A | 2/1997 | Raimi | |
| 6,117,181 A | 9/2000 | Dearth et al. | |
| 6,195,627 B1 | 2/2001 | Bargh et al. | |
| 6,195,629 B1 | 2/2001 | Bargh et al. | |
| 6,202,042 B1 | 3/2001 | Bargh et al. | |
| 6,285,914 B1 | 9/2001 | Bae et al. | |
| 6,345,242 B1 | 2/2002 | Dearth et al. | |
| 6,393,426 B1 | 5/2002 | Odom et al. | |
| 6,519,612 B1 | 2/2003 | Howard et al. | |
| 6,546,532 B1 | 4/2003 | Kerzman et al. | |
| 6,581,191 B1 | 6/2003 | Schubert et al. | |
| 6,618,839 B1 | 9/2003 | Beardslee et al. | |
| 6,668,364 B2 | 12/2003 | McElvain et al. | |
| 6,687,710 B1 | 2/2004 | Dey | |
| 6,720,565 B2 | 4/2004 | Innes et al. | |
| 6,751,583 B1 | 6/2004 | Clarke et al. | |
| 6,754,763 B2 | 6/2004 | Lin | |
| 7,047,521 B2* | 5/2006 | Bunnell ...................... 717/130 |
| 7,236,918 B2* | 6/2007 | Roesner et al. ............... 703/14 |
| 7,239,993 B2* | 7/2007 | Roesner et al. ............... 703/13 |
| 2002/0019969 A1 | 2/2002 | Hellestrand et al. | |
| 2002/0032559 A1 | 3/2002 | Hellestrand et al. | |

(Continued)

*Primary Examiner*—Kamini S Shah
*Assistant Examiner*—Herng-Der Day
(74) *Attorney, Agent, or Firm*—Dillon & Yudell LLP

(57) ABSTRACT

According to a method of simulation processing, a simulation model is received that includes a plurality of design entity instances modeling a digital system and one or more instrumentation entity instances, separate from the plurality of design entity instances, that generate instances of instrumentation events for testing purposes during simulation. In response to receiving an exclusion list identifying at least one instance of one or more instrumentation events to be removed from the simulation model, at least one instance of the one or more instrumentation events and associated logic elements are removed from the one or more instrumentation entity instances of the simulation model prior to simulation, such that a more compact simulation model is obtained.

1 Claim, 29 Drawing Sheets

U.S. PATENT DOCUMENTS

| | | |
|---|---|---|
| 2002/0049576 A1 | 4/2002 | Meyer |
| 2002/0123874 A1 | 9/2002 | Roesner et al. |
| 2002/0128809 A1 | 9/2002 | Roesner et al. |
| 2002/0129333 A1 | 9/2002 | Chandhoke et al. |
| 2002/0152060 A1 | 10/2002 | Tseng |
| 2003/0005416 A1 | 1/2003 | Henftling et al. |
| 2003/0035375 A1 | 2/2003 | Freeman |
| 2003/0037222 A1 | 2/2003 | Emberson et al. |
| 2003/0101039 A1 | 5/2003 | Gabele et al. |
| 2003/0121011 A1 | 6/2003 | Carter et al. |
| 2003/0144828 A1 | 7/2003 | Lin |
| 2003/0188299 A1 | 10/2003 | Broughton et al. |
| 2003/0192032 A1 | 10/2003 | Andrade et al. |
| 2005/0102125 A1 | 5/2005 | Tseng |
| 2005/0125754 A1 | 6/2005 | Schubert et al. |
| 2005/0137840 A1 | 6/2005 | Peck et al. |

* cited by examiner

```
ENTITY FXUCHK IS
    PORT(  S_IN      :  IN std_ulogic;
           Q_IN      :  IN std_ulogic;
           R_IN      :  IN std_ulogic;
           clock     :  IN std_ulogic;
           fails     :  OUT std_ulogic_vector(0 to 1);
           counts    :  OUT std_ulogic_vector(0 to 2);
           harvests  :  OUT std_ulogic_vector(0 to 1);
         );
```
⎫ 450

452 { --!! BEGIN
      --!! Design Entity: FXU;

453 { --!! Inputs
      --!! S_IN    =>   B.C.S;
      --!! Q_IN    =>   A.Q;
      --!! R_IN    =>   R;
      --!! CLOCK   =>   clock;
      --!! End Inputs 454 { --!! Fail Outputs;
      --!! 0 : "Fail message for failure event 0";
      --!! 1 : "Fail message for failure event 1";
      --!! End Fail Outputs;

455 { --!! Count Outputs;
      --!! 0 : <event0> clock;
      --!! 1 : <event1> clock;
      --!! 2 : <event2> clock;
      --!! End Count Outputs;

456 { --!! Harvest Outputs;
      --!! 0 : "Message for harvest event 0";
      --!! 1 : "Message for harvest event 1";
      --!! End Harvest Outputs;

457 { --!! End;

ARCHITECTURE example of FXUCHK IS

BEGIN
    ... HDL code for entity body section ...   ⎬ 458
END;

*(PRIOR ART)*

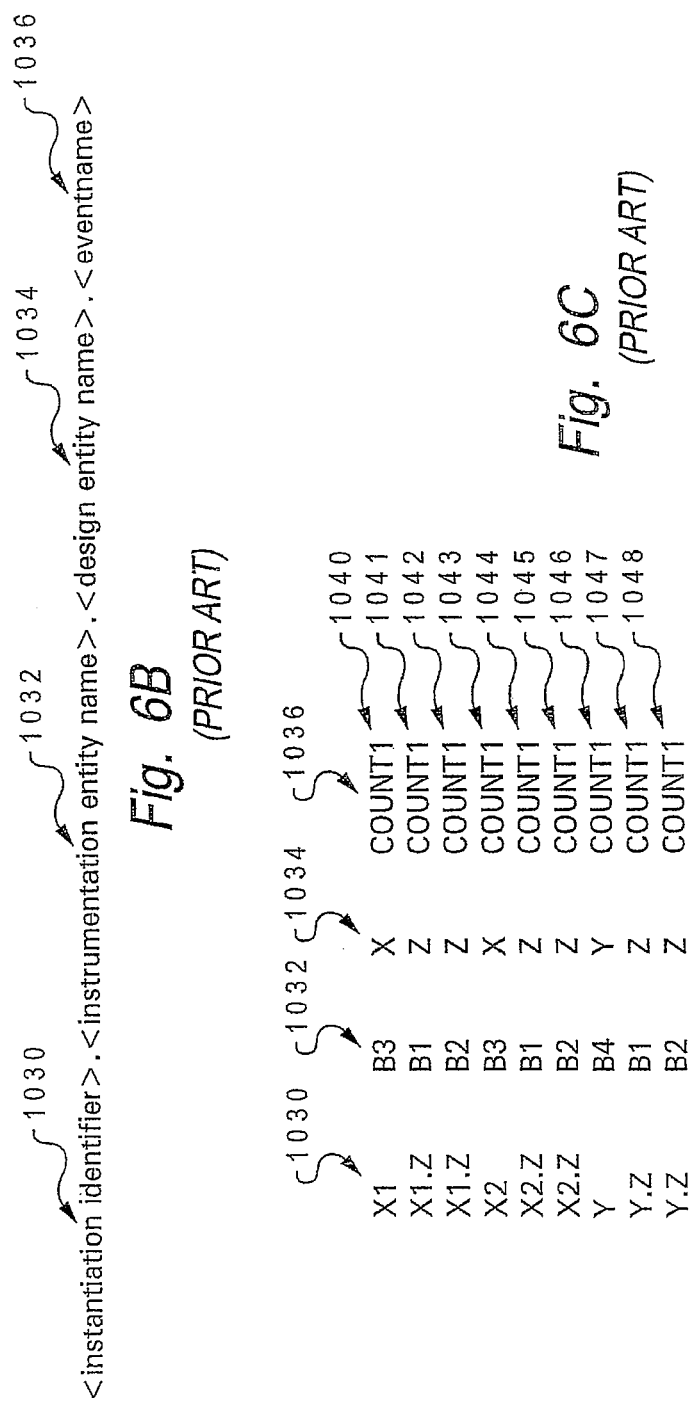
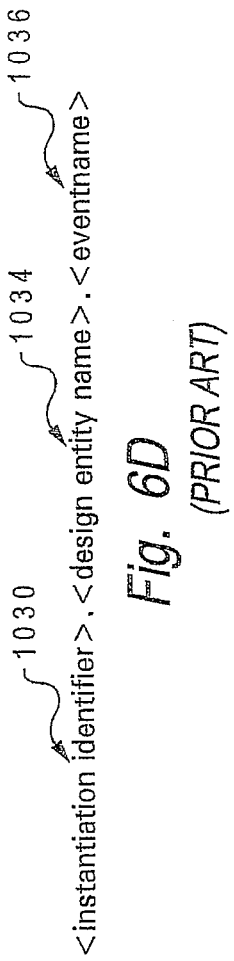
Fig. 6B
(PRIOR ART)
Fig. 6C
(PRIOR ART)
Fig. 6D
(PRIOR ART)

```
                          1163      1165
--!! Inputs                 ⌒    ⌒―――――⌒
--!! event_1124 _in = > C.[B2.count.event_1124 ];  ⌒⌐1161
--!! event_1108 _in = > A.B.[B1.count.event_1108 ]; ⌐1162
--!! End Inputs         ⌣⌣⌣ ⌣―――――――――⌣
                        1164      1166
```

*Fig. 7B*
(PRIOR ART)

```
--!! Inputs                                        ⌐1171
--!! event_1124 _in = > C.[count.event_1124 ]; ⌐1172
--!! event_1108 _in = > A.B.[count.event_1108 ];
--!! End Inputs
```

*Fig. 7C*
(PRIOR ART)

```
ENTITY X IS
    PORT(    :
             :
             :
         );
ARCHITECTURE example of X IS
BEGIN
    .
    .
    .
    ... HDL code for X ...
    .
    .
    .
1221 {  Y:Y
        PORT MAP(    :
                     :
                 );

1222 {  A <= ....
        B <= ....
        C <= ....
                                              ╭1230
1223 {  --!! [count, countname0, clock] => Y.P;     ╭1232
        --!! Q => Y. [B1.count.count1] AND A;  ╭1234
        --!! [fail, failname0, "fail msg"] => Q XOR B;
        --!! [harvest, harvestname0, "harvest msg"] => B AND C;
    END;                                       ╲1236
```
⎬ 1220

*Fig. 8B*

*(PRIOR ART)*

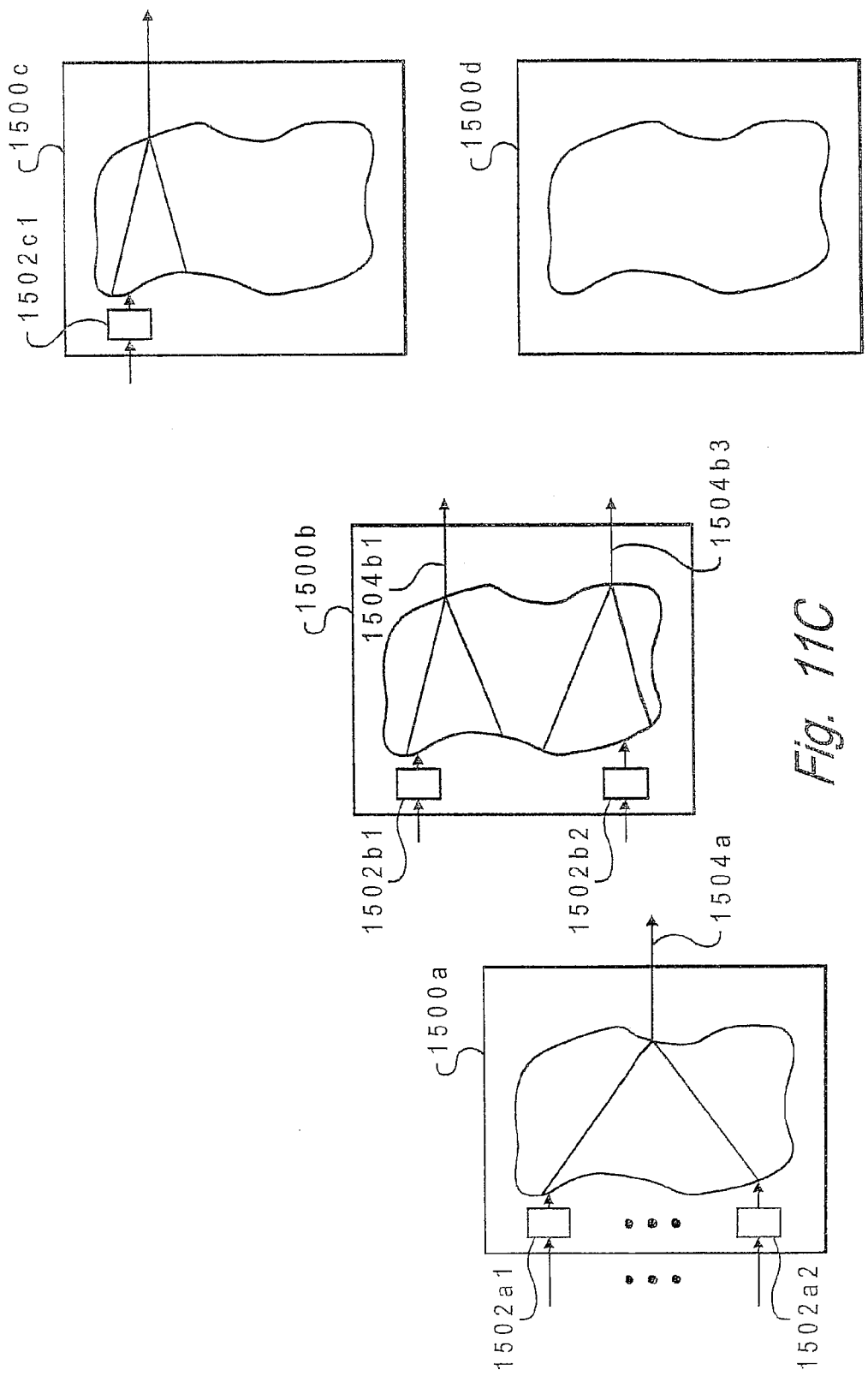

METHOD, SYSTEM AND PROGRAM PRODUCT FOR SELECTIVELY REMOVING INSTRUMENTATION LOGIC FROM A SIMULATION MODEL

CROSS-REFERENCE TO RELATED APPLICATION

The present invention is related to the U.S. patent application Ser. No. 10/970,468, which is incorporated herein by reference in its entirety.

BACKGROUND OF THE INVENTION

1. Technical Field

The present invention relates in general to designing and simulating digital devices, modules and systems, and in particular, to a method and system for computer simulation of digital devices, modules and systems utilizing a hardware description language (HDL) model. More particularly, the present invention relates to methods, systems, and program products for selectively removing instrumentation logic from a simulation model.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. In either case, a translation from an HDL description to a simulation format, hereinafter referred to as a simulation executable model or simulation model, is required.

SUMMARY OF THE INVENTION

The present invention recognizes that simulation performance is generally enhanced if the simulation executable model is compact. Accordingly, in one embodiment of the present invention, a simulation model is received that includes a plurality of design entity instances modeling a digital system and one or more instrumentation entity instances, separate from the plurality of design entity instances, that generate instances of instrumentation events for testing purposes during simulation. In response to receiving an exclusion list identifying at least one instance of one or more instrumentation events to be removed from the simulation model, at least one instance of the one or more instrumentation events and associated logic elements are removed from the one or more instrumentation entity instances of the simulation model prior to simulation, such that a more compact simulation model is obtained.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 3C illustrates exemplary sections of HDL syntax that maybe utilized in accordance with the teachings of the present invention;

FIG. 6B depicts a data structure for declaring an event within a simulation model in accordance with one embodiment of the present invention;

FIG. 6C illustrates a list of extended event data structures for the simulation model in FIG. 6A;

FIG. 6D depicts a data structure for declaring an event within a simulation model in accordance with an alternate embodiment of the present invention;

FIG. 7B depicts a set of input port mapping comments for performing hierarchical processing of simulation model events in accordance with a first embodiment of the present invention;

FIG. 7C illustrates a set of input port mapping comments for performing hierarchical processing of simulation model events in accordance with a second embodiment of the present invention;

FIG. 8B illustrates an exemplary HDL file for implementing instrumentation logic within an HDL design entity in accordance with the teachings of the present invention;

FIGS. 11A-11D depict the selective removal of instrumentation event instances and associated logic from a simulation model in accordance with the present invention.

DETAILED DESCRIPTION OF A PREFERRED EMBODIMENT

The present invention provides for accurate and comprehensive monitoring of a digital circuit design in which a designer creates instrumentation modules, for example, utilizing the same hardware description language (HDL) as utilized for the design itself. HDLs, while suited to the needs of digital designers, can also be effectively utilized for a number of checking functions. In accordance with the present invention, instrumentation modules are utilized to monitor specified design parameters while not becoming compiled as an integral part of the design itself. Furthermore, since the instrumentation modules are written in the same HDL as utilized in the actual design, such modules are platform and simulator independent. Unlike checking done with C or C++ programs, HDL instrumentation can be compiled and run directly without loss of performance on hardware simulators.

Figure 1:
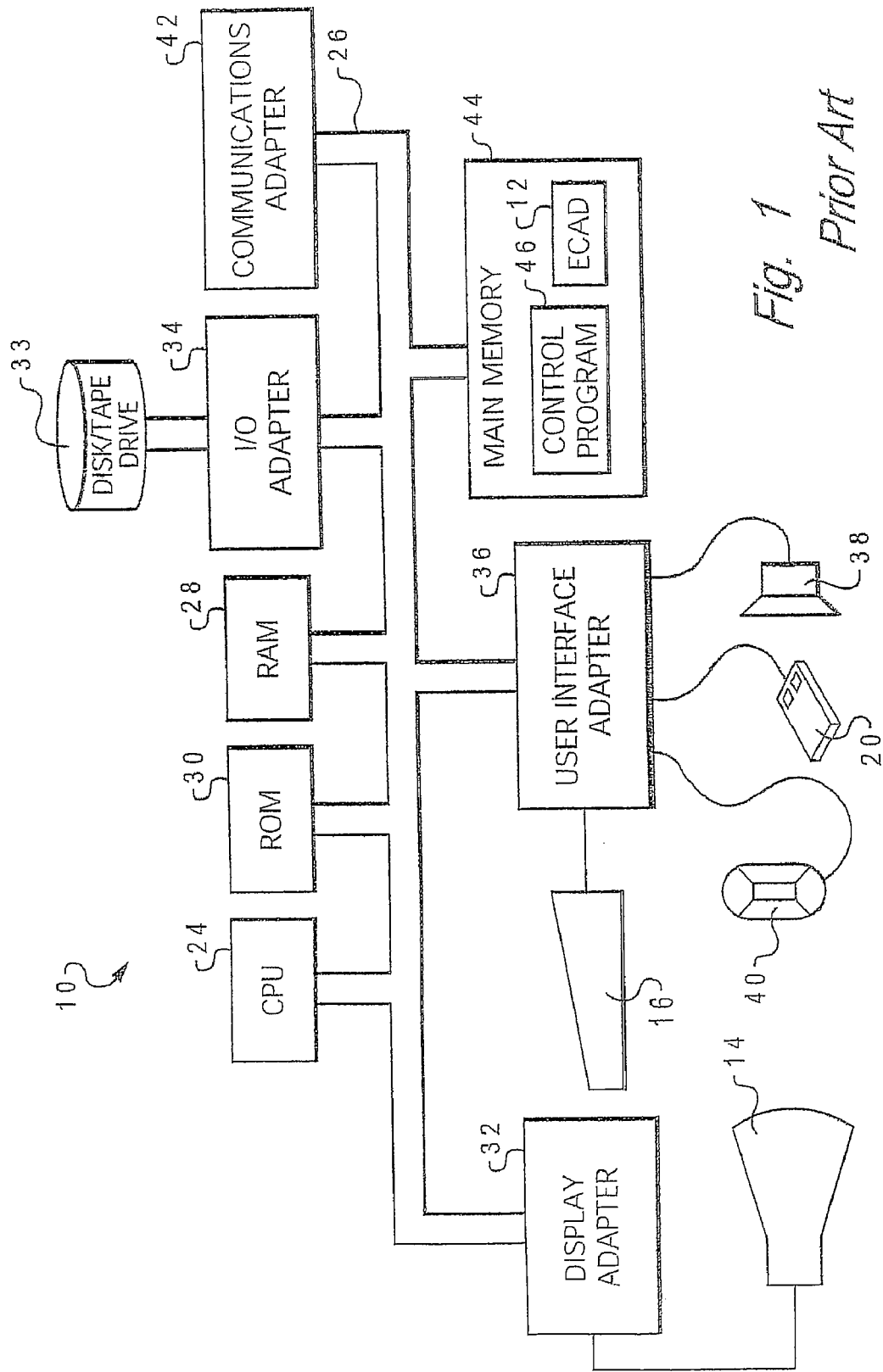
FIG. 1 depicts a exemplary data processing system that may be utilized to practice the present invention.

With reference now to the figures, and in particular with reference to FIG. 1, there is depicted a pictorial representation of a data processing system 10 with which the present invention may be advantageously utilized. As illustrated, data processing system 10 includes one or more Central Processing Units (CPUs) 24, such as a conventional microprocessor, and a number of other components interconnected via a system interconnect 26. CPU(s) 24 execute or interpret the instructions comprising computer programs, in part by performing the arithmetical and logical functions indicated by such instructions. Although not depicted in FIG. 1, CPUs such as CPU 24 typically include a control unit that organizes data and program storage in a computer memory and transfers the data and other information between the various parts of the computer system. Such CPUs also generally include one or more execution units that execute instructions to perform arithmetical and logical operations, such as addition, comparison, multiplication and so forth.

Data processing system 10 further includes random-access memory (RAM) 28, read-only memory (ROM) 30, a display adapter 32 for connecting system interconnect 26 to display device 14, and an I/O adapter 34 for connecting peripheral devices (e.g., optical, disk and tape drives 33) to system interconnect 26.

Data processing system 10 further includes user interface adapter 36 for connecting keyboard 16, mouse 20, speaker 38, microphone 40, and/or other user interface devices to system interconnect 26. Communications adapter 42 further connects data processing system 10 to one or more other computers and/or a communication network.

The nonvolatile and/or volatile internal storage of data processing system 10 (e.g., main memory 44, ROM 30, RAM 28 and/or disk/tape drive 33) stores software including a conventional operating system and additional middleware and/or application software. Such additional software includes an ECAD tool 12 that is processed by CPU(s) 24 to permit the development and verification of a digital circuit design in accordance with the present invention. ECAD tool 12 preferably presents a graphical user interface (GUI) via display device 14 with which a digital circuit designer can interact using a keyboard 16 and mouse 20. Thus, by entering appropriate inputs utilizing keyboard 16 and mouse 20, the digital circuit designer is able to develop and verify a digital circuit design according to the method described further hereinbelow. The additional software further includes a control program 46 (shown within main memory 44) that, when processed by CPU 24, carries out the operations depicted in FIG. 2C and FIG. 3D and described below.

Figure 2A:
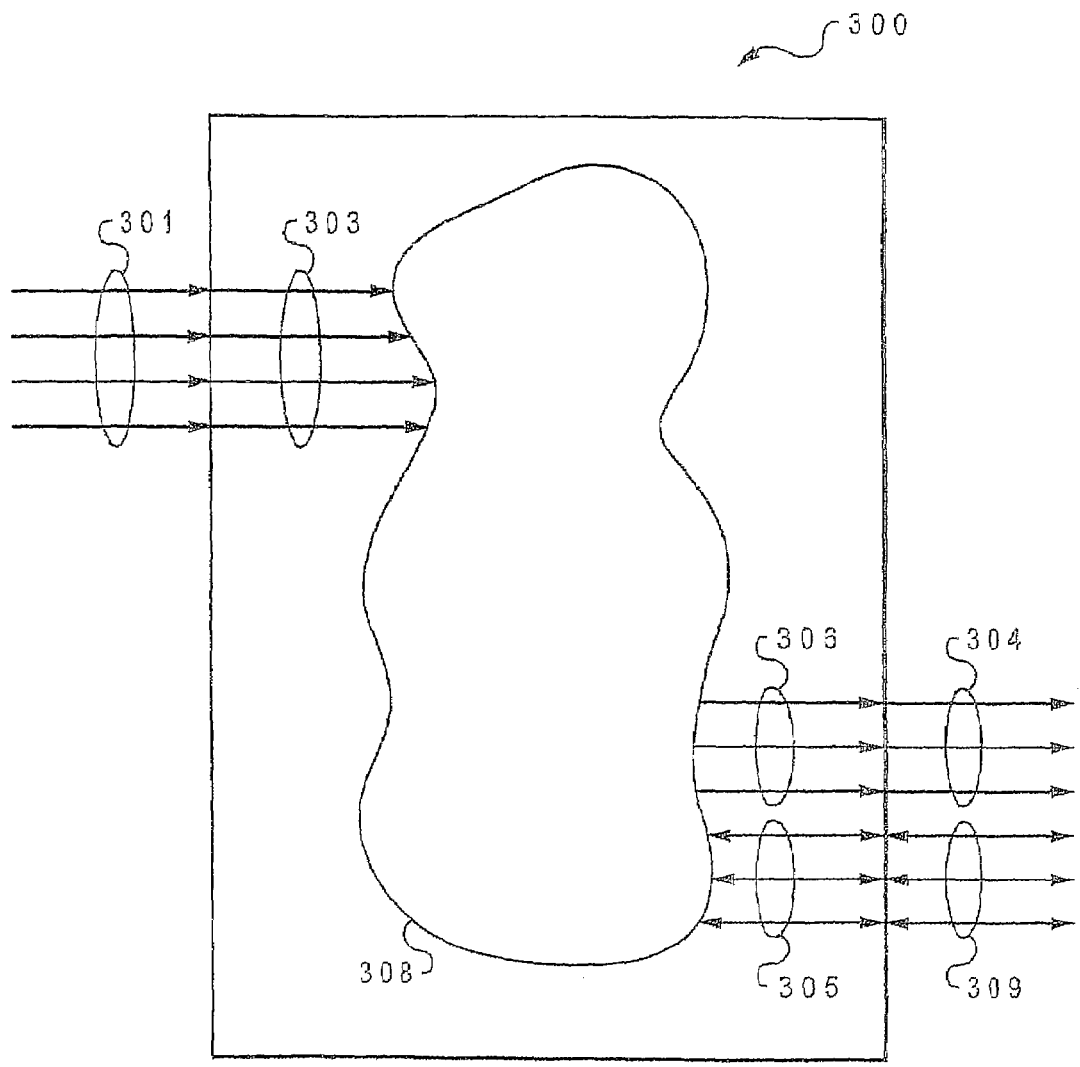
FIG. 2A is a simplified block diagram illustrating a digital design entity that may be instrumented in accordance with the teachings of the present invention.

Simulated digital circuit design models are comprised of at least one and usually many sub-units referred to hereinafter as design entities. FIG. 2A is a block diagram representation of an exemplary design entity 300. Design entity 300 is defined by a number of components: an entity name, entity ports, and a representation of the function performed by design entity 300. Each entity within a given model has a unique name (not explicitly shown in FIG. 2A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 2A) indicates a specified correspondence between entity port names and external signals to which the entity is connected. When building a simulation model, ECAD tool 12 is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 2B:
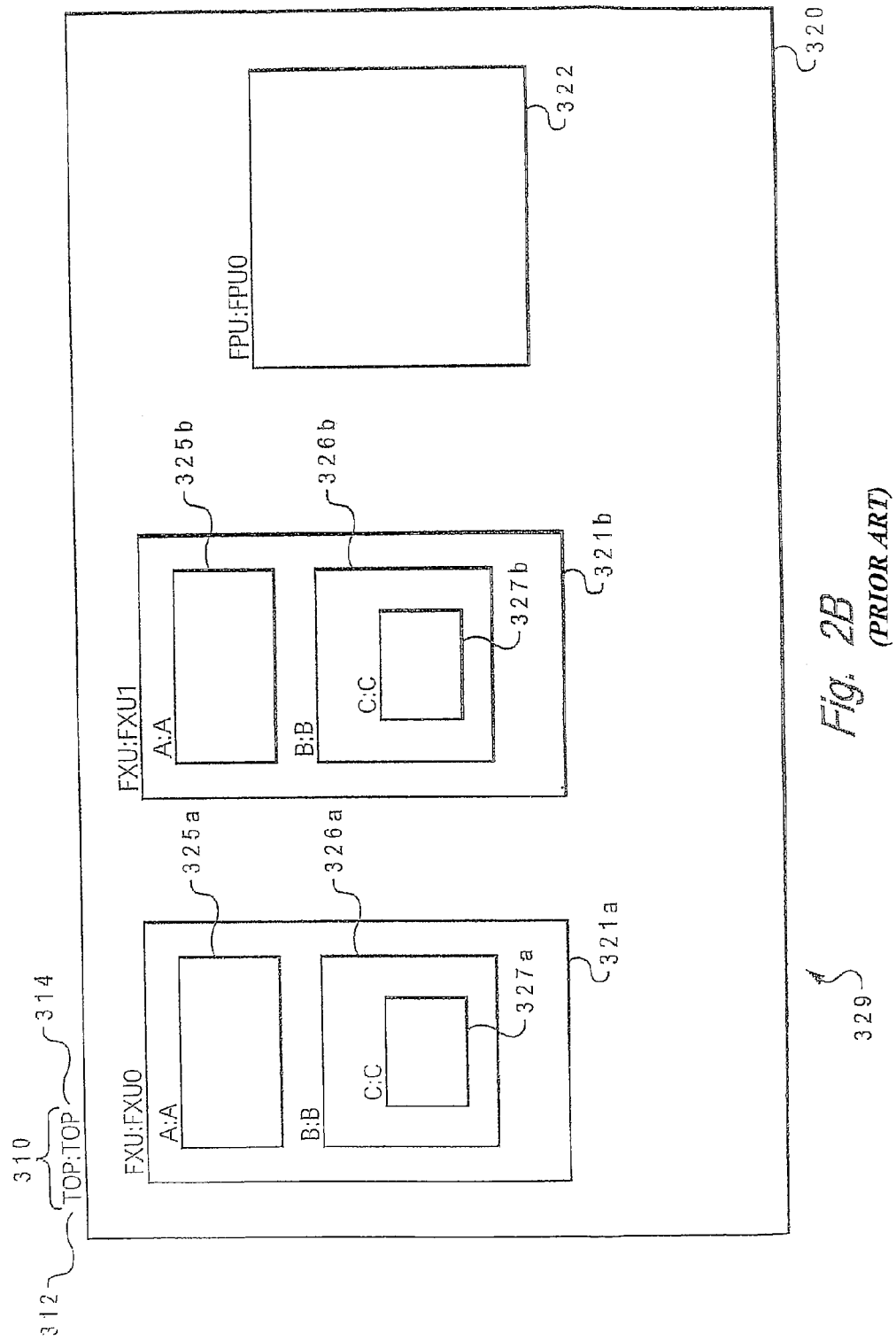
FIG. 2B is a diagrammatic representation depicting a simulation model that may be instrumented in accordance with the teachings of the present invention.

Referring now to FIG. 2B, there is illustrated a diagrammatic representation of an exemplary simulation model 329 that may be utilized in a preferred embodiment of the present invention. Simulation model 329 includes of multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 includes of top-level entity 320 which directly instantiates two instances, 321*a* and 321*b*, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321*a* and 321*b* of FXU entity 321. Instantiations 321*a* and 321*b* are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321*a* and 321*b*. At any given level of a simulation model hierarchy, the instantiation names of all instantiations must be unique.

In addition to FXU entity instantiations 321*a* and 321*b*, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321*a* of FXU entity 321, single instance entities 325*a* and 326*a* of entity A 325 and entity B 326 respectively, are directly instantiated. Similarly, instantiation 321*b* of the same FXU entity contains instantiations 325*b* and 326*b* of entity A 325 and entity B 326 respectively. In a similar manner, instantiation 326*a* and instantiation 326*b* each directly instantiate a single instance of entity C 327 as entities 327*a* and 327*b* respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string built from the enclosing entity instantiation names proceeding from the top-level entity instantiation name. For example, the instantiation identifier of instantiation 327*a* of entity C 327 within instantiation 321*a* of FXU entity 321 is "TOP.FXU0.B.C". This identifier serves to uniquely identify each instantiation within a simulation model.

Figure 2C:
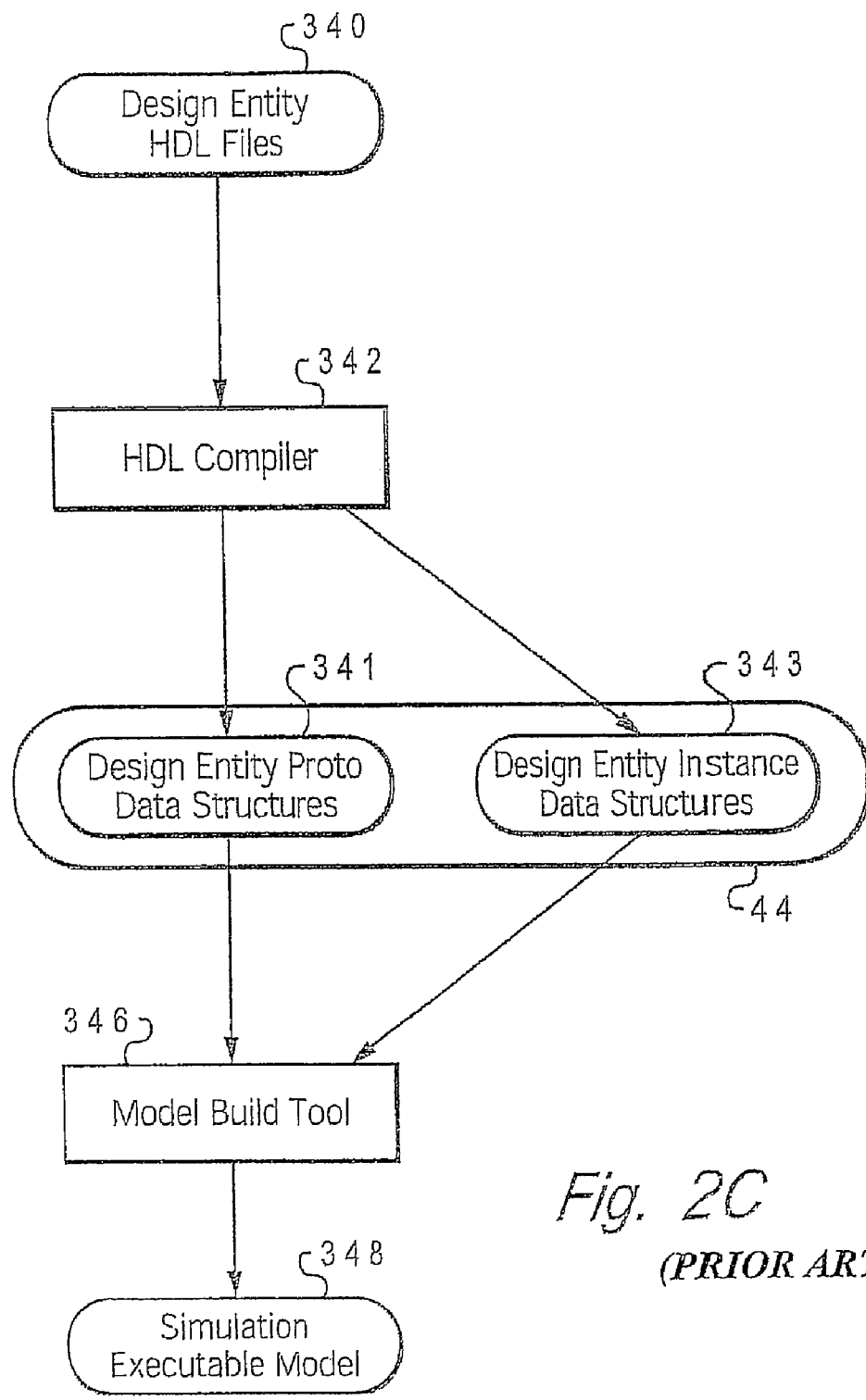
FIG. 2C is a flow diagram illustrating of a model build process that may be implemented in accordance with the teachings of the present invention.

Referring now to FIG. 2C, there is depicted a flow diagram of a model build process which may be implemented in a preferred embodiment of the present invention. The process begins with one or more design entity HDL source code files 340. HDL compiler 342 processes HDL file(s) 340 beginning with the top level entity of a simulation model and proceeding in a recursive fashion through all HDL file(s) describing a complete simulation model.

HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 2B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, FPU entity 322, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXUO 321a and FXU:FXU1 321b, by top-level entity 320. Each instantiation of FXU entity 321 creates a unique set of instances of the FXU, A, B, and C entities.

Returning to FIG. 2C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above).

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

Figure 2D:
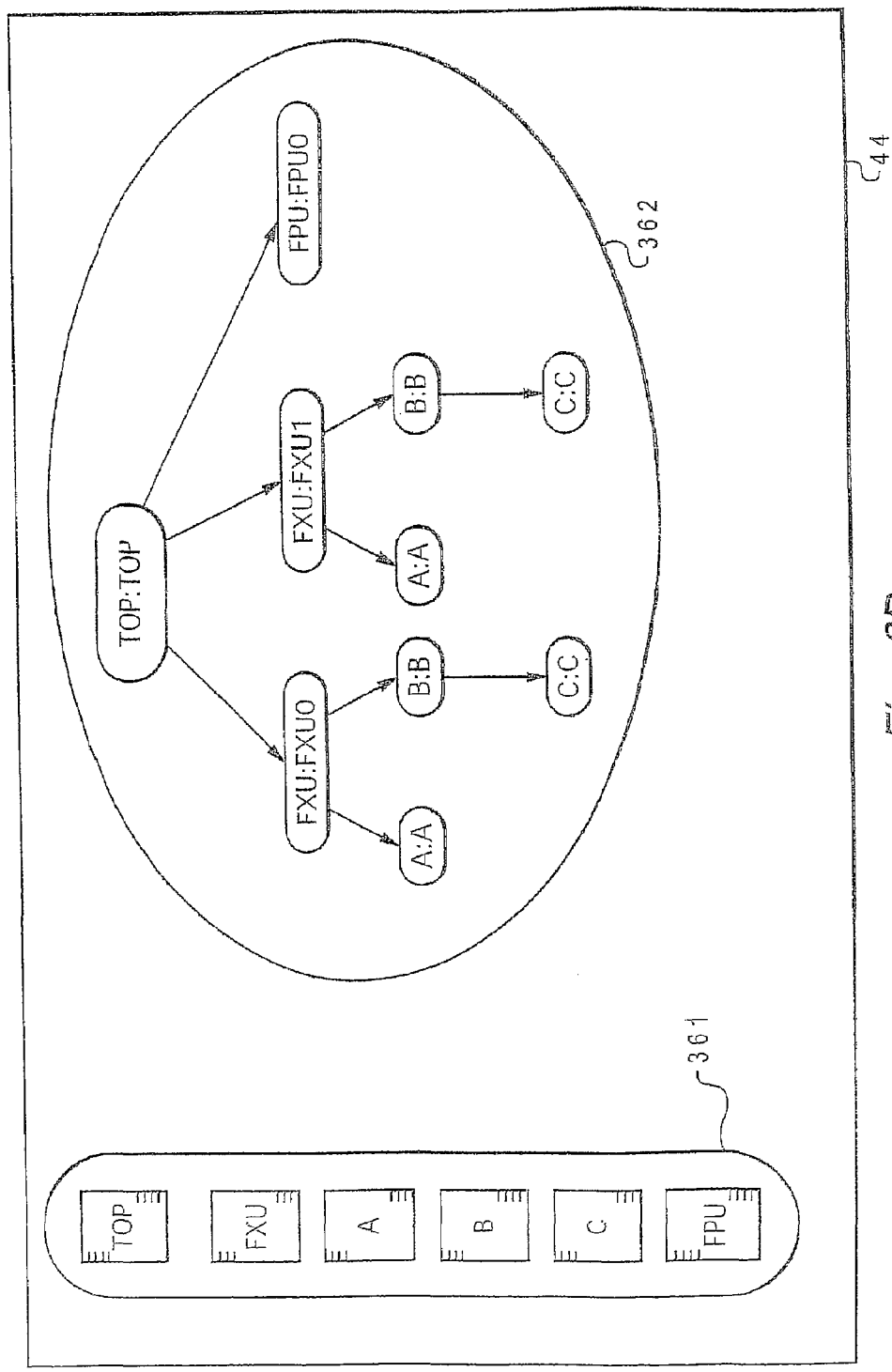
FIG. 2D is a block diagram depicting data structures that maybe instrumented in accordance with the teachings of the present invention.

With reference now to FIG. 2D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 2C processes the contents of memory 44 into memory data structures in order to produce simulation executable model 348.

In order to instrument simulation models, the present invention makes use of entities known as "instrumentation entities," which are in contrast to the entities constituting a design which are referred to herein as "design entities". As with design entities, instrumentation entities are described by one or more HDL source code files and include a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 3A:
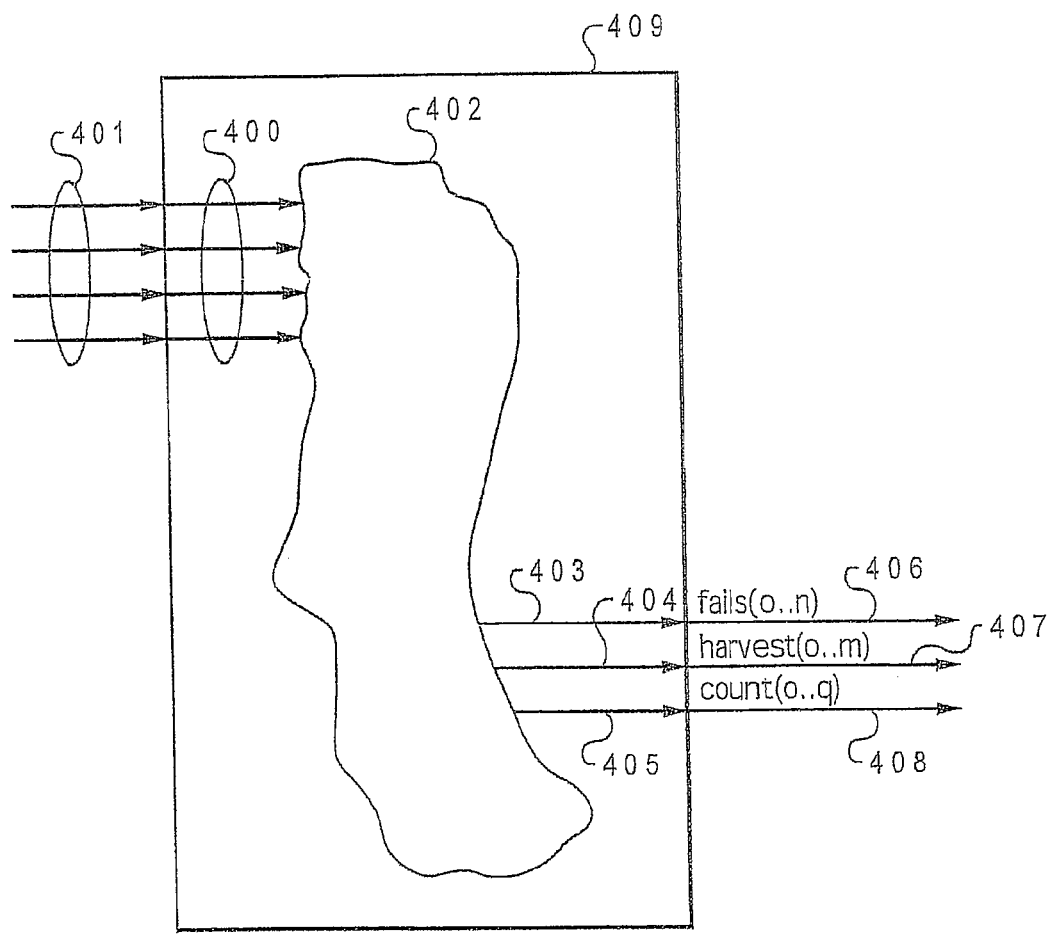
FIG. 3A is a simplified block diagram representative of an instrumentation entity.

With reference now to FIG. 3A, there is illustrated a block diagram representation of an instrumentation entity 409. Instrumentation entity 409 includes a number of input ports 400 that are connected to signals 401 within a target entity (not depicted in FIG. 3A). A body section 402 contains logic necessary to detect occurrences of specified conditions within the target entity and generate simulation model "events" with respect to signals 401. Three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 3B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 3B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 3B:
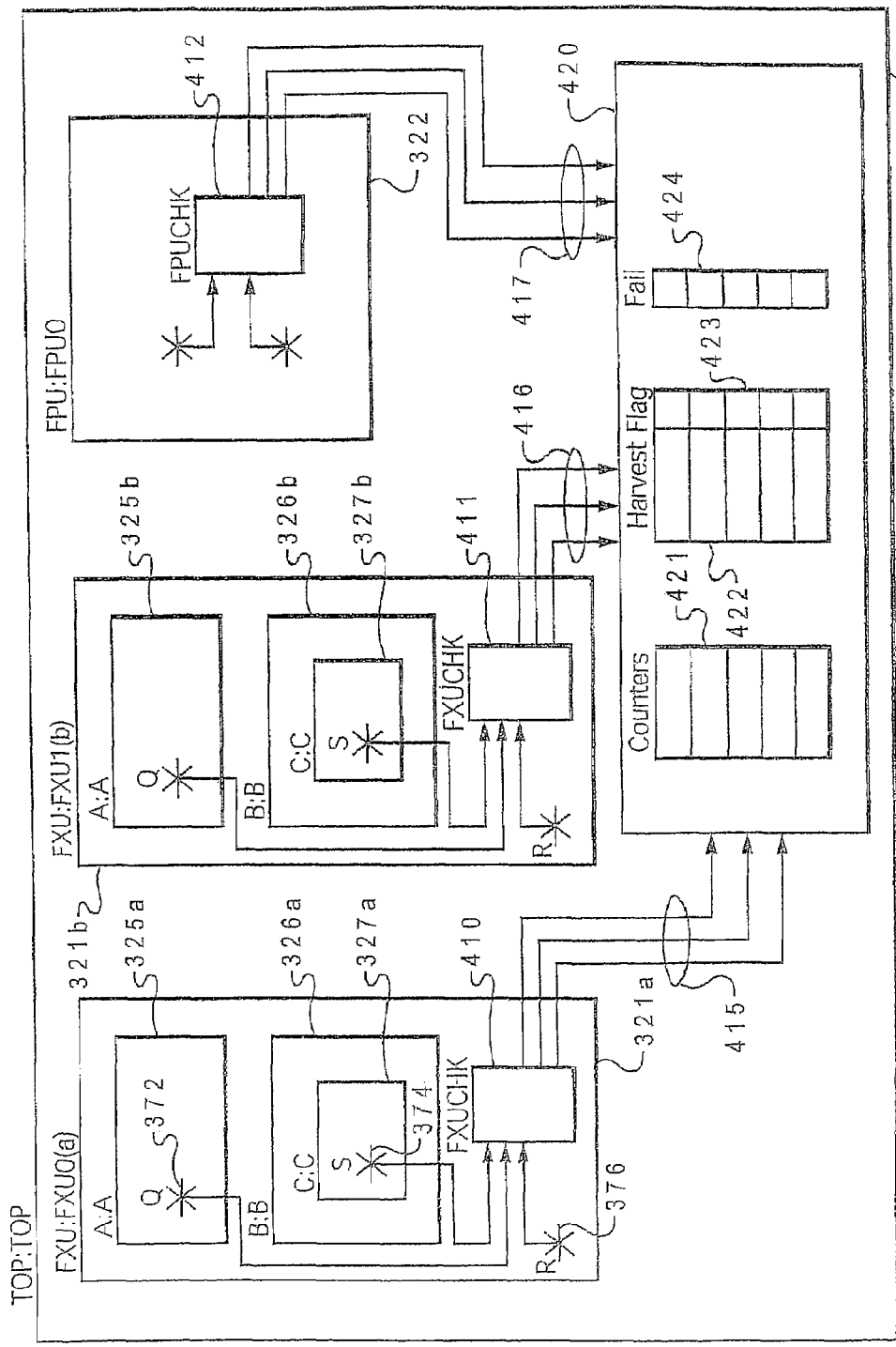
FIG. 3B is a simplified block diagram of a simulation model instrumented in accordance with the teachings of the present invention.

With reference now to FIG. 3B, there is depicted a block diagram representation of simulation model 329 instrumented in accordance with the teachings of the present invention. As can be seen in FIG. 3B, an instance 410 and an instance 411 of an instrumentation entity FXUCHK are utilized to monitor instances 321a and 321b of an FXU entity. For each FXU instantiations of 321a and 321b, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 3B, entity FXUCHK monitors a signals Q 372, a signal R 376, and a signal S 374 within each of instances 321a and 321b of the FXU entity. Signal Q 372, is a signal within the instances 325a and 325b of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the three event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 3C, there is illustrated an exemplary HDL file 440 that describes instrumentation entity FXUCHK depicted in FIG. 3B. HDL file 440 utilizes the syntax of the VHDL hardware description language. In the VHDL language, lines beginning with two dashes ("--") are recognized by a compiler as being comments. The method and system of the present invention utilize comments of a non-conventional form to indicate information about an instrumentation entity. FIG. 3C depicts one embodiment of the present invention in which comments begin with two exclamation points in order to distinguish these comments from conventional comments in instrumentation HDL file 440. It will be appreciated by those skilled in the art that the exemplary syntax utilized in FIG. 3C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports: fails (0 to 1), counts(0 to 2), and harvests(0 to 1), are declared. These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 3C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent port_name is the name of the instrumentation entity port to be connected to the target entity signal. The trgt_ent_signal name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which includes the instance names of the entities within the target entity each separated by periods ("."). This identification string is pre-pended to the signal name. The signal mapping comment within input port map 453 for signal S 374 is therefore as follows:

--!! S_IN=>B.C.S;

This syntax allows an instrumentation entity to connect to any signal within the target entity or the target entity's descendant entities. A signal appearing on the top level of the target design entity, has no pre-pended entity names; and therefore, has the following signal mapping comment:

--!! R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required and the system of the present invention will automatically make the connect. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname> "failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 FIG. 3B. The variable name provides a means to identify and reference the particular counter associated with a particular count event. Thus, a comment of the form "--!! n: <varname> qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse, as will be further described hereinbelow. The parameter "qualifying_signal" is followed by A+/−A to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname> "harvest message";" where n is an integer denoting which harvest event the message is to be associated with, <eventname> is the unique harvest event name and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event within the model (count, fail and harvest) model in such a manner as to insure that each event has a unique name with certain useful properties.

Finally, epilogue comment 457 includes a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 3D:
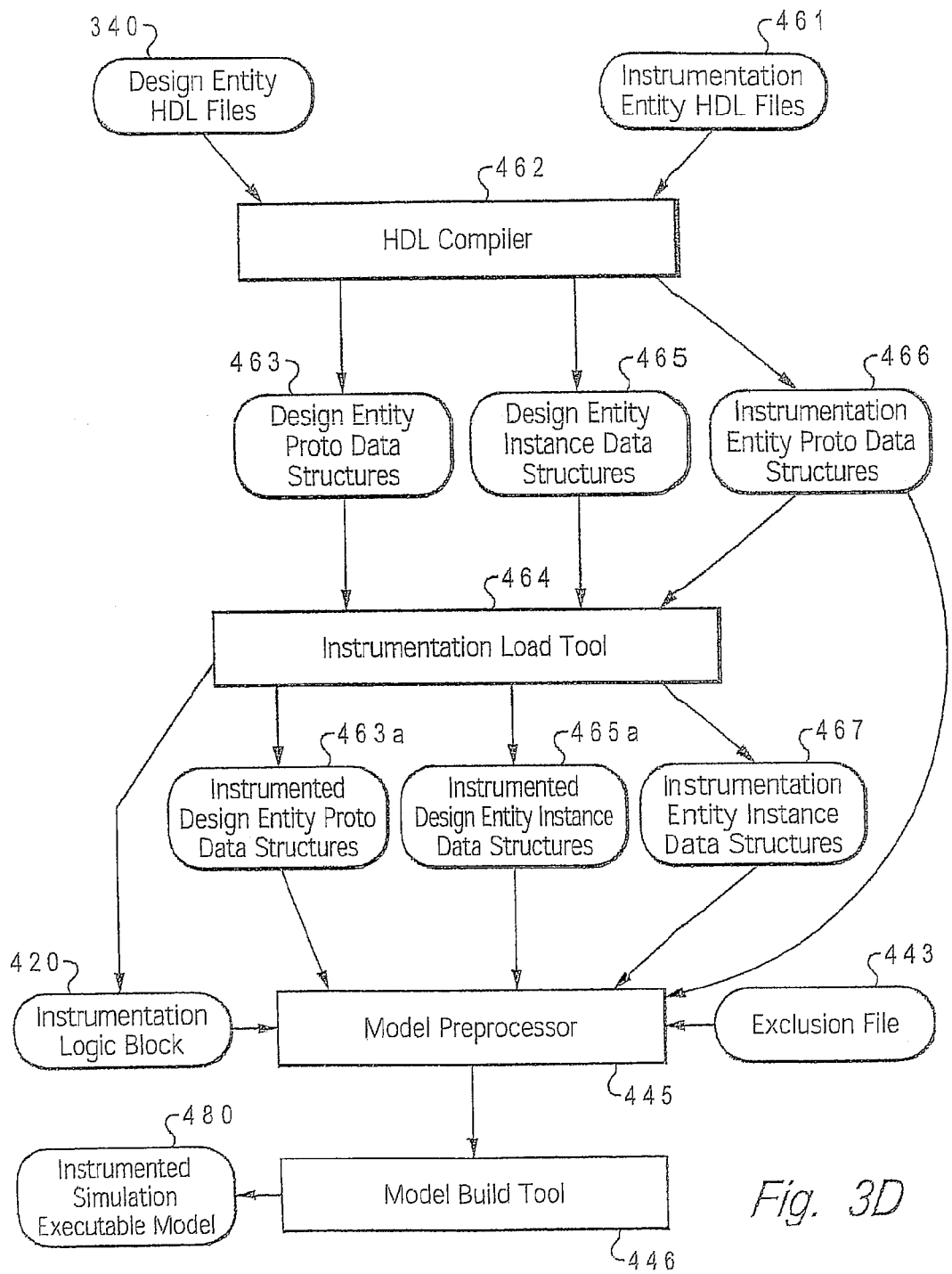
FIG. 3D is a flow diagram depicting a model build process in accordance with the teachings of the present invention.

With reference now to FIG. 3D, there is depicted an exemplary model build process in accordance with the teachings of the present invention. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 3D begins with design entity HDL files 340 and instrumentation entity HDL files 461. HDL compiler 462 compiles design entity HDL files 340 and instrumentation entity HDL files 461 in order to produce in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466 are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

For each target entity loaded from design entity HDL files 340, instrumentation load tool 464 must alter its design proto data structure 463 and its design instance data structure 465 to instantiate an associated instrumentation entity. An instrumented design proto data structure 463*a* and instrumented design instance data structure 465*a* are thereby produced. In addition, instrumentation load tool 464 creates an instrumentation instance data structure 467 for each instrumentation entity associated with the current design entity.

Finally, instrumentation load tool 464 creates a unique proto and instance data structure for instrumentation logic block 420 and connects the fail, harvest, and count event signals from each instrumentation entity instantiation to instrumentation logic block 420. In-memory proto and instance data structures 463*a*, 465*a*, 467, 466, instrumentation logic block 420, and optionally an exclusion list (which may be contained in an exclusion file 443) are received and processed by a model preprocessor 445.

Figure 3E:
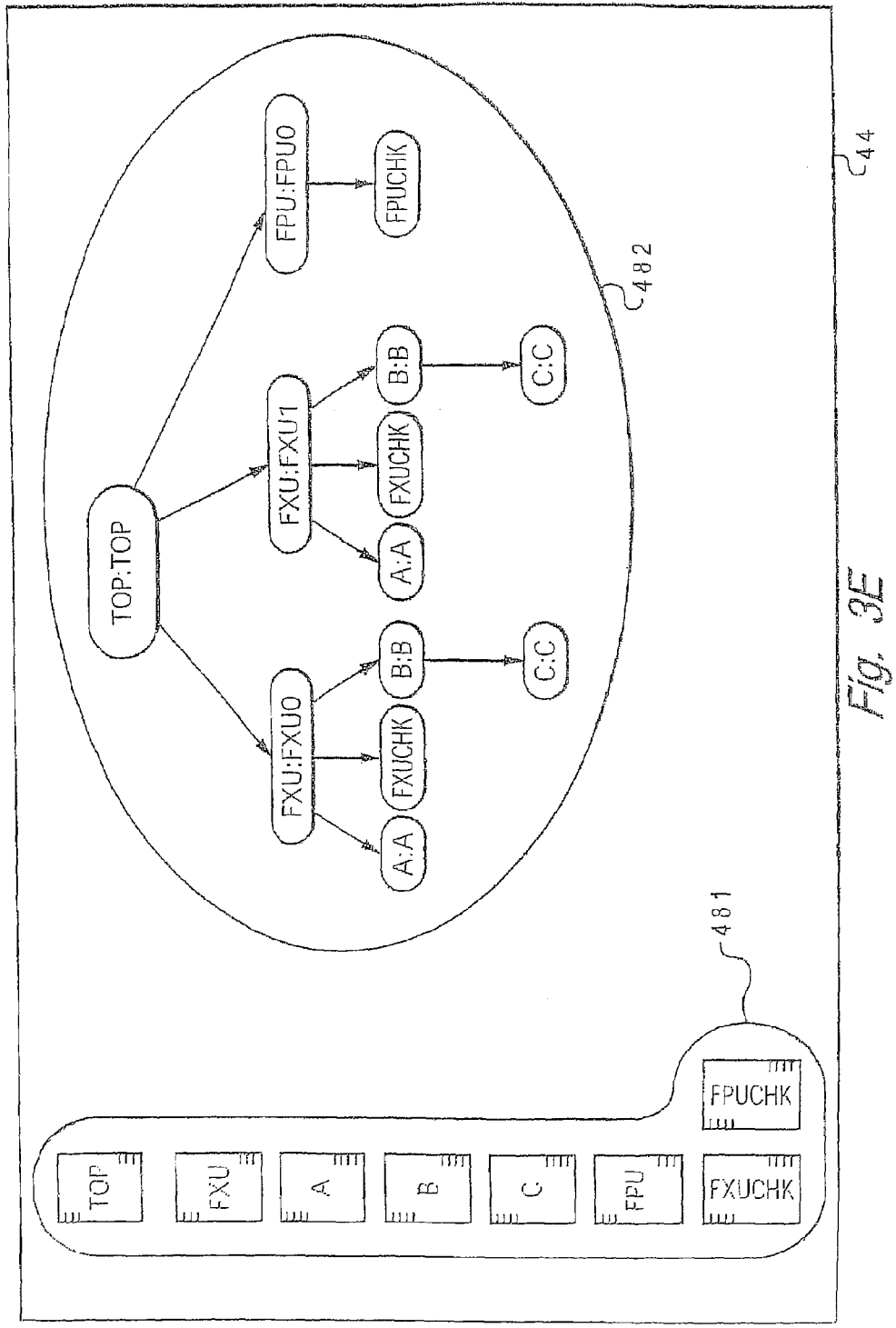
FIG. 3E is a block diagram representation of memory data structures constructed in accordance with the teachings of the present invention.

In an exemplary embodiment, model preprocessor 445 performs at least two functions. First, model preprocessor 445 "flattens" the simulation model. As depicted in FIG. 3E, in-memory proto and instance data structures 463*a*, 465*a*, 467, 466 describe the simulation model in an "unflattened" representation. The unflattened representation of the simulation model includes a set of proto data structures 481 containing a single proto for each respective instrumentation or design entity belonging to the simulation model. Each such proto serves as a template for all the instances of that entity within the simulation model. The unflattened representation further includes an instance data structure 482 containing pointers and references to those entities that describe the overall structure of the simulation model. For example, FIG. 3E depicts an exemplary instance data structure 482 indicating an instantiation of instrumentation entity FXUCHK in each of the two instances of design entity FXU and an instantiation of instrumentation entity FPUCHK within the single instance of design entity FPU. Instance data structure 482 thus indicates the hierarchical nature of the instantiations of the design and instrumentation entities within the simulation model utilizing pointers and references to proto data structures 481.

Model preprocessor 445 "flattens" the simulation model by creating a "sea of gates" representation of the simulation model containing explicit copies of all the gates and other logic elements of each instance of each entity within the simulation model. Thus, the flattened representation of the simulation model contains, in addition to or in lieu of instance data structure 482, explicit copies of all the logic elements of the design and instrumentation entities rather than merely pointers to proto data structures 481.

Second, as described in greater detail below, the flattening of the simulation model by model preprocessor 445 facilitates the selective removal of individual instances of a given instrumentation event from some or all instrumentation entity instances instantiating the event. In one preferred embodiment, the event instances to be removed are indicated by an exclusion list contained in one or more exclusion files 443, which are described in detail below with reference to FIG. 9A.

The flattened simulation model produced by model preprocessor 445 is passed to model build tool 446, which produces an instrumented simulation executable model 480.

Figure 4:
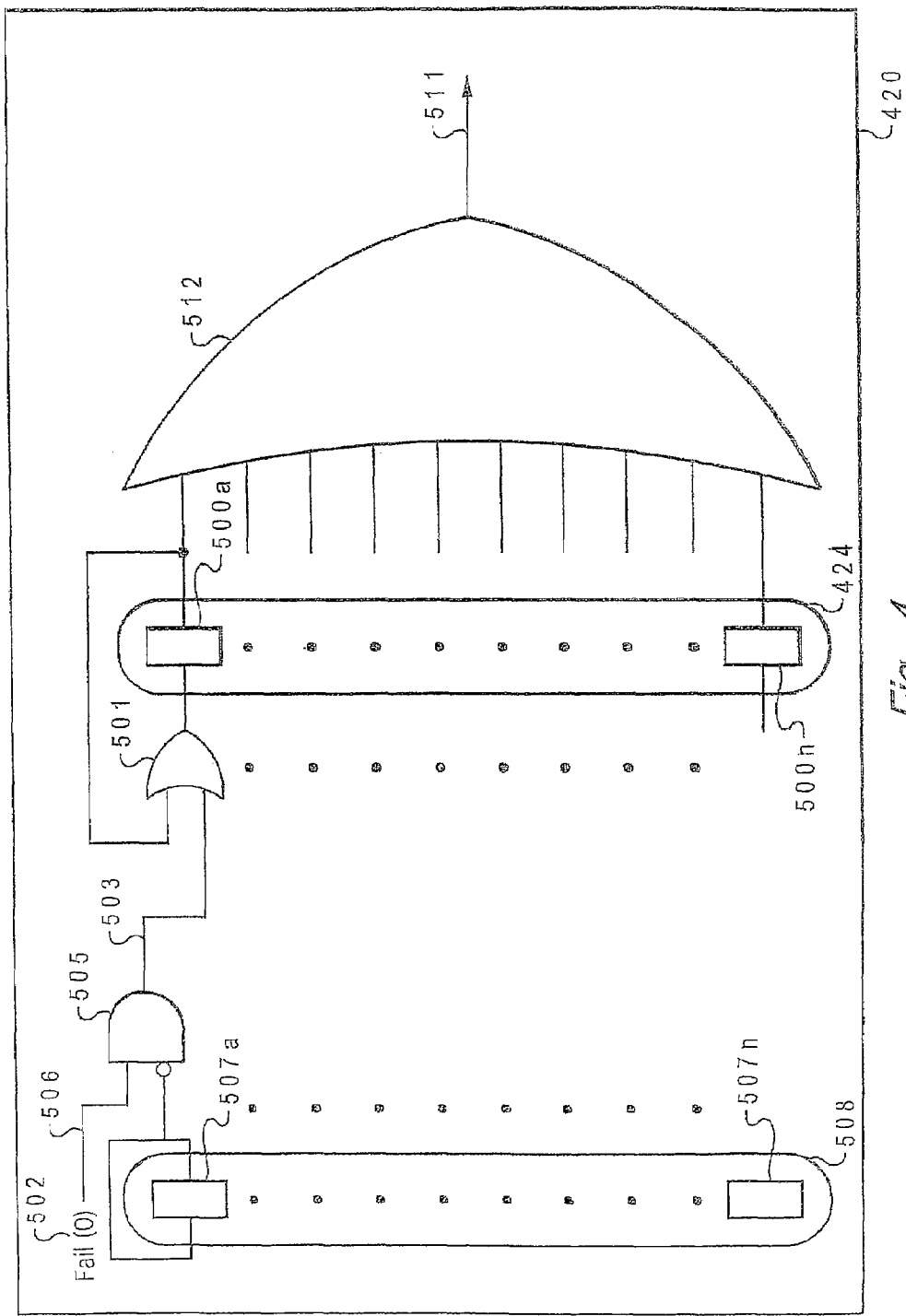
FIG. 4 is a logic diagram representation of a runtime disable mechanism in accordance with the teachings of the present invention.

With reference now to FIG. 4, failure flags 424 of instrumentation logic block 420 are depicted in greater detail. Failure flags 424 are registers 500a-500n utilized to accept and store an indication of the occurrence of a failure event. In what follows, the operation of a single failure flag for a particular failure event 502 will be discussed. The operation of all failure flags is similar.

Register 500a holds a value that represents whether a failure event 502 has occurred or not. Register 500a is initially set to a value of '0' by the simulation run-time environment at the beginning of a simulation run. When failure event 502, if enabled at register 507a, occurs, register 500a is set to a value of a logical '1', thereby indicating the occurrence of a failure event. Register 500a is driven by logical OR gate 501. Logical OR gate 501 performs a logical OR of the output of register 500a and a qualified failure signal 503 to create the next cycle value for register 500a. In this manner, once register 500a is set to a logical '1' by the occurrence of an enabled failure event, register 500a maintains the value of a logical '1' until reset by the simulation runtime environment. Likewise, register 500a maintains a value of '0' from the beginning of the simulation run until the occurrence of the failure event, if enabled.

Qualified failure signal 503 is driven by logical AND gate 505. Logical AND gate 505 produces, on qualified failure signal 503, the logical AND of failure signal 506 and the logical NOT of register 507a. Register 507a serves as an enabling control for qualified failure signal 503. If register 507a contains a value of '0', logical AND gate 505 will pass failure event signal 506 unaltered to qualified failure signal 503. In this manner, the monitoring of the failure event is enabled. Registers 507a-507n are set, by default, to a value of '0'. However, if register 507a contains a value of a '1', qualified failure signal 503 will remain at a value of '0' irrespective of the value of failure event signal 506, thereby disabling the monitoring of failure event 502. In this manner, register 508, which includes registers 507a-507n, can mask the occurrence of any subset of failure events in the overall simulation model from registers 500a-500n.

To efficiently implement the ability to selectively disable the monitoring of failure events, the simulation run-time environment includes a function that allows a user to disable monitoring of a specific failure event for a given instrumentation entity. This function will automatically set the appropriate registers among registers 507a-507n within register 508 to disable the monitoring of a particular failure event for every instance of the instrumentation entity within the overall simulation model. Instrumentation load tool 464 and model build tool 446 encode sufficient information within instrumented simulation executable model 480 to determine which failure bits within register 508 correspond to which instrumentation entities.

The ability to selectively disable monitoring of failure events is of particular use in large batch-simulation environments. Typically, in such an environment, a large number of general purpose computers, running software or hardware simulators, are dedicated to automatically running a large number of simulation runs. If a simulation model with a faulty instrumentation entity that incorrectly indicates failure events is run in such an environment, a large number of erroneous failures will be generated causing lost time. By selectively disabling failure events within instrumentation entities, the present invention allows simulation to continue while only disabling erroneous failure signals rather than having to disable all failure monitoring. This option is particularly useful when the process of correcting a faulty instrumentation entity and creating a new simulation model is substantially time consuming. The present invention also provides similar enabling and disabling structures for the harvest and count events within a model.

Figure 5:
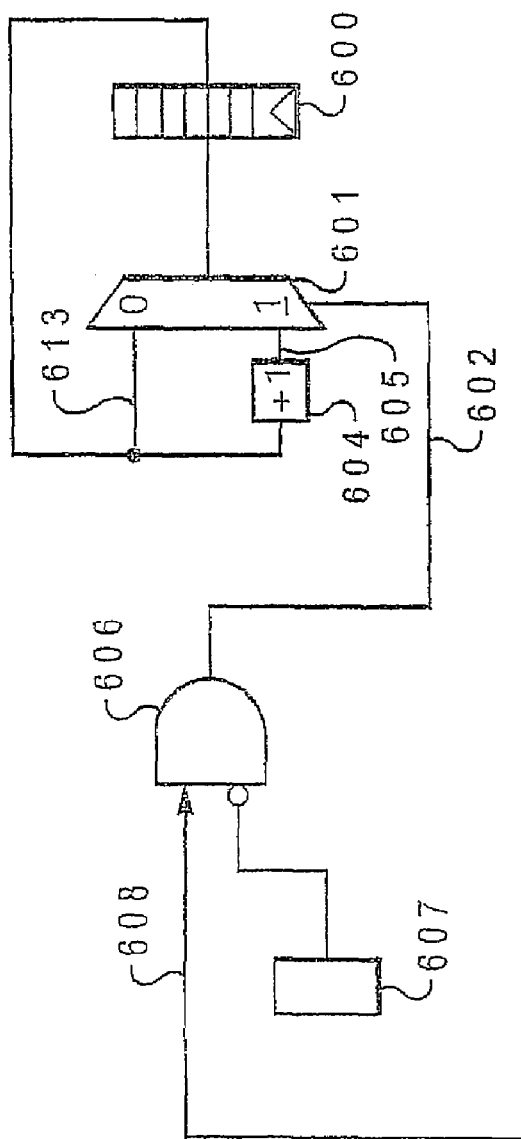
FIG. 5 is a simplified gate level representation of an exemplary counting instrument with a runtime disable feature and automatic clocking adjustment in accordance with the teachings of the present invention.
Figure 5:
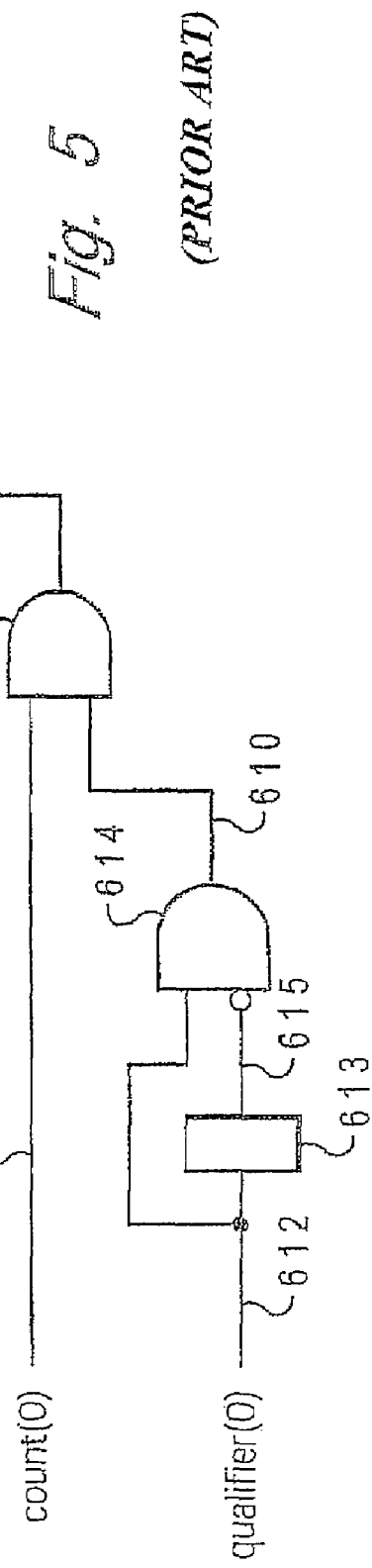

With reference now to FIG. 5, there is depicted a gate level representation of exemplary logic for one counter of counters 421 within instrumentation logic block 420 depicted in FIG. 3B. Each counter of 421 is represented by a multi-bit simulator latch 600. Simulator latch 600 is initialized by the simulation runtime environment to a value of zero at the beginning of a simulation run. Simulator latch 600 is updated every simulator cycle and is driven by multiplexer 601. Multiplexer 601, controlled by selector signal 602, selects between signal 613, the current value of simulator latch 600, and signal 605, the current value of simulator latch 600 incremented by 1 by incrementer 604, to serve as the next cycle value for simulator latch 600. By selecting signal 605, multiplexer 601 causes the counter value within simulator latch 600 to be incremented when a count event occurs. It should be noted, however, that simulator latch 600 is updated every simulator cycle irrespective of the number of simulator cycles that correspond to a design cycle for the logic being monitored by a counting instrument. Logical AND gate 606 and simulator latch 607 serve to disable the monitoring of count event signal 609 in a manner similar to that described above for the disabling of failure events. Signal 608 is count event signal 609 further qualified by signal 610 by means of logical AND gate 611.

Signal 610 insures that simulator latch 600 will be incremented, if count event signal 609 is active, only once per design cycle for the logic being monitored by a counting instrument irrespective of the number of simulation cycles utilized to model the design cycle. This clocking normalization is necessary to ensure that the event counts recorded in counters 421 correspond directly to the number of design cycles the event occurred in and not the number of simulator cycles the event occurred in. For example if an event occurs in two design cycles where design cycle require four simulators cycles, it is preferable to have the event counter reflect a value of two rather than a value of eight as would occur if the counter were allowed to update in every simulator cycle.

Furthermore, if the count event being monitored is within a portion of the logic with a run-time selectable frequency of operation, it is useful to have the count registers reflect the number of occurrences of the event in terms of design cycles. For example, consider a circumstance where a count event occurs twice during two different simulation runs. In the first run, assume that four simulator cycles are needed to represent each design cycle. Further assume in the second run that twelve simulator cycles are necessary to represent each design cycle. Without a clocking normalization mechanism, the first run would indicate that the event occurred eight times (two occurrences times four simulator cycles per occurrence) and the second run would indicate that the event occurred twenty-four times (two occurrences times twelve simulator cycles per occurrence) when in fact the event actually only occurred twice in both simulation runs. Therefore, it would be advantageous to limit the updating of counters 421 such that each counter is only updated once per design cycle irrespective of the number of simulator cycles, possibly variable at run-time, needed to represent a design cycle.

In simulation models in which multiple simulator cycles are utilized to represent a single design cycle, explicit clocking signals are utilized within the model to control the updating of the various design storage elements. These clocking signals specify in which simulator cycles the simulator latches representing design storage elements are allowed to update. A clocking signal is asserted high for some contiguous number of simulator cycles at either the beginning or end of the design cycle and asserted low for the remaining simulator cycles within the design cycle. If the clocking signal is asserted high during the beginning of the design cycle, the clock is referred to as a "high-active" clock and, likewise, if the clocking signal is asserted low during the beginning of the design cycle, the clock is referred to as a "low-active" clock.

Each count event signal has an associated qualifying signal as specified by counter declaration comments 455 as described above. Typically, these qualifying signals are connected to the clocking signals within the design responsible for updating the storage elements within the portion of logic monitored by the count event. The qualifying signal for the count event for simulator latch 600, qualifying signal 612, is depicted as a high-active qualifier signal. Qualifying signal 612 is processed by simulator latch 613 and logical AND gate 614, to produce signal 610 which is active high for one and only one simulator cycle within the design cycle delineated by qualifying signal 612.

Still referring to FIG. 5, incrementer 604 represents but one possible mechanism that may be utilized to implement the next logic state for a given counter within the present invention. As depicted in FIG. 5, incrementer 604 ensures that counters 421 within a model are cycled through a series of values whose binary patterns correspond to the customary representation of non-negative integers. In one embodiment of the present invention, incrementer 604 is comprised of an adder that increments the current value of counter 600 by a unit value each time signal 605 is selected by selector signal 602. This exemplary implementation provides for convenience of decoding the value of counter 600 at the termination of a simulation run, but does so at a cost in overhead that is not acceptable in many simulators.

For software simulators, one of two basic approaches maybe utilized to model an incrementer, such as incrementer 604. In the first approach, the incrementer is modeled directly by an ADD or INCREMENT instruction in the simulation execution model. When incrementers are modeled directly as a single instruction within the simulation execution model, the use of incrementer 604 provides for efficient counters within a simulation execution model.

The present invention discloses a method and system for naming events within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event: count, fail, and harvest, is given a separate event namespace by construction. Each event class is therefore an independent group preventing naming collisions between the event types. The data structure of the present invention is independently applied to each of the different event types to ensure correctness within each event class.

In the embodiments illustrated in FIGS. 6A, 6B, 6C, and 6D, the system and method of the present invention are described with respect to count events. One skilled in the art will appreciate and understand the extensions necessary to apply the same techniques to other event classes such as failures or harvests.

Figure 6A:
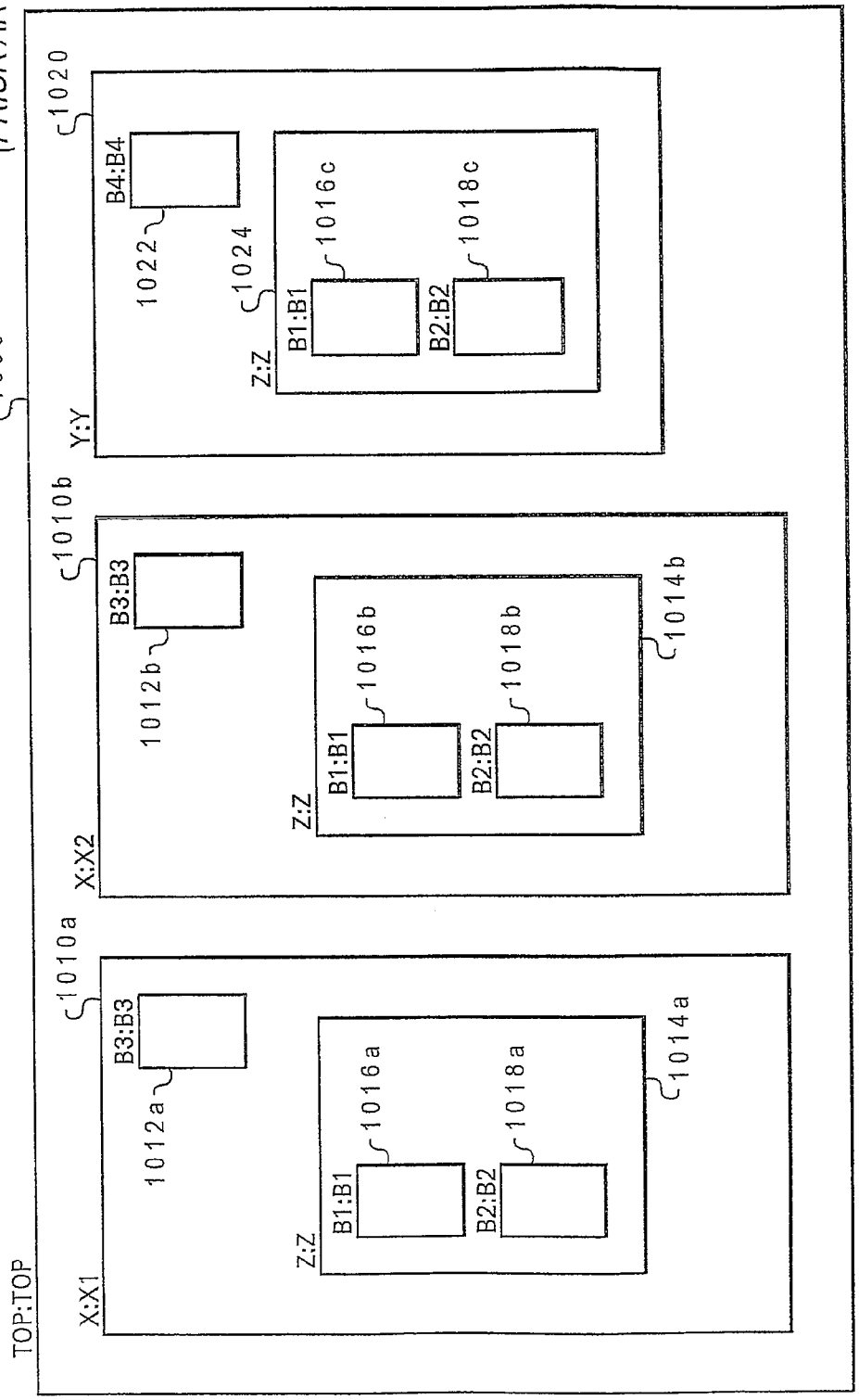
FIG. 6A is a block diagram illustrating a simulation model containing a number of design and instrumentation entities.

With reference to FIG. 6A, there is depicted a block diagram representation of simulation model 1000 containing a number of design and instrumentation entities. As illustrated in FIG. 6A, simulation model 1000 includes two instances of a design entity X, with instance names X1 and X2 respectively.

Within each of design entity instances X1 and X2 is instantiated an instance of an instrumentation entity B3, 1012*a* and 1012*b*. Design entity instances X1 and X2 further comprise instances, 1014*a* and 1014*b*, respectively, of design entity Z which further contains instances, 1016*a* and 1016*b*, of instrumentation entity B1 and instances, 1018*a* and 1018*b*, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016*c* and 1018*c*, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the method and system of the present invention, the user must uniquely name each type of event (count, fail, or harvest) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model and leverages the uniqueness property of entity names and the uniqueness of each instance's instantiation identifier to create an "extended event identifier" for each event within the simulation model.

With reference to FIG. 6B, there is illustrated a representation of the fields in an extended event identifier data structure, alternatively referred to herein as an "event list", in accordance with one embodiment of the present invention. The extended event identifier begins with instantiation identifier field 1030. This field, as described hereinbefore, is formed of the instance identifiers, proceeding from the top level entity to the direct ancestor of the given instance within the simulation model separated by periods ("."). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 6C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count1 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

In an alternative embodiment of the present invention, the instrumentation entity name is not included within the extended event identifier. Referring to FIG. 6D, such an alternative extended event identification data structure is depicted. As shown in FIG. 6D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 6D provides for simpler naming and referencing of events at the expense of requiring the user to prevent name collisions for events associated with a given design entity.

Returning to FIG. 6B, the combination of instrumentation entity field 1032, design entity name field 1034, and eventname field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG.

6C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entity B1 within the X1.Z instance of design entity Z utilizes the following count eventname:

X1.Z B1 Z COUNT1, which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

Figure 7A:
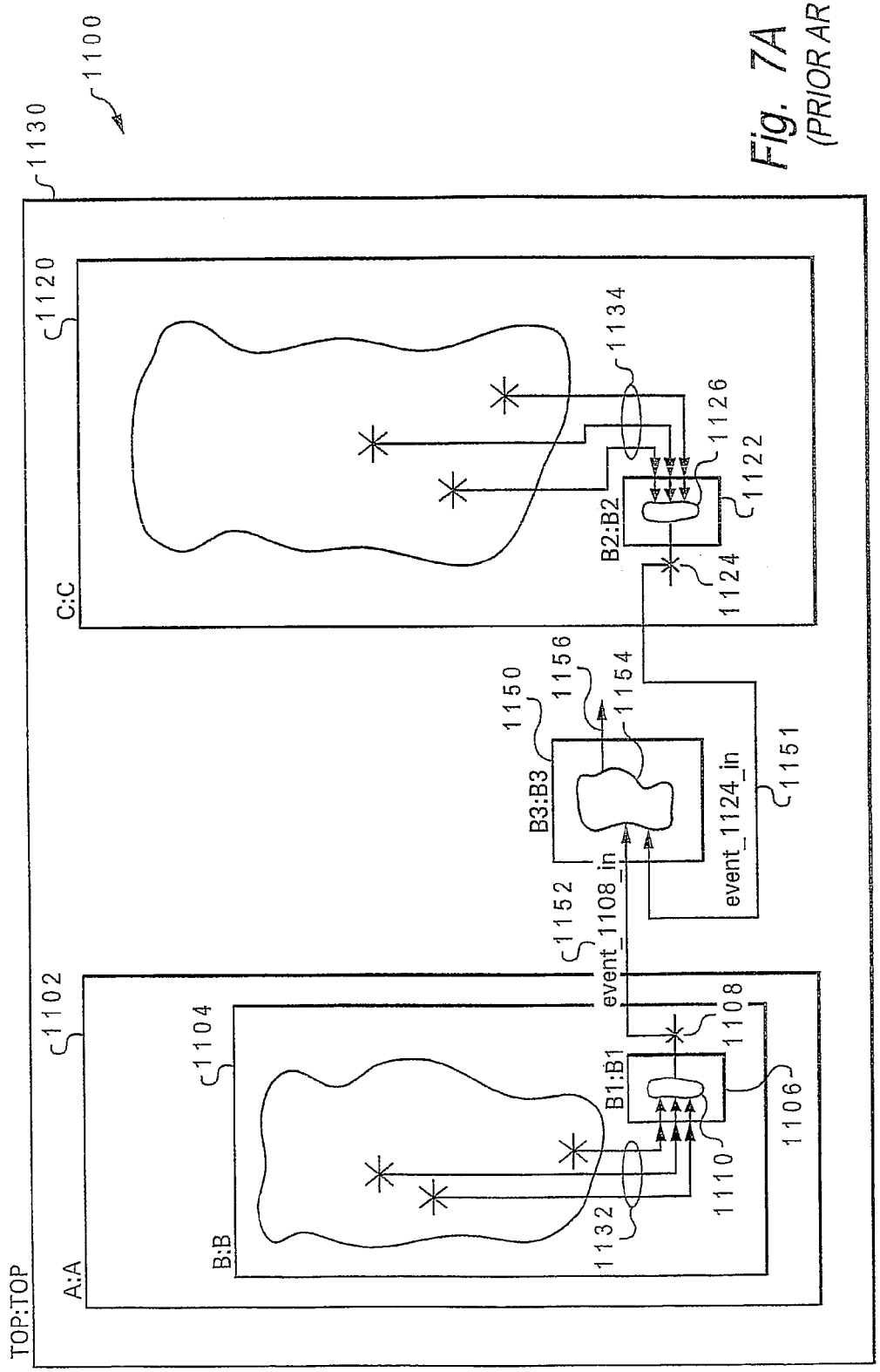
FIG. 7A is a block diagram illustrating a simulation model in which the hierarchical event processing of the present invention is applicable.

With reference to FIG. 7A, there is depicted a block diagram illustrating a simulation model 1100 in which the hierarchical event processing of the present invention is applicable. Simulation model 1100 comprises a top-level design entity 1130 in which a pair of lower-level design entities 1102 and 1120 is instantiated. A design entity 1104 containing instrumentation entity 1106 is included within design entity 1102. As illustrated in FIG. 7A, instrumentation entity 1106 includes logic 1110 for generating a simulation event 1108 from signal set 1132 from within design entity 1104. Design entity 1120 includes an instrumentation entity 1122 that generates a simulation event 1124 using signal set 1134.

Utilizing the techniques described hereinbefore, generating a hierarchical event that is some logical combination of events 1108 and 1124 requires the creation of an instrumentation entity associated with top level design entity 1130 that references signal sets 1132 and 1134. Conventionally, such an instrumentation entity would substantially reproduce instrumentation logic 1110 and 1126 to process signal sets 1132 and 1134, respectively, thus producing a copy of events 1108 and 1124. Such a procedure is inefficient and prone to error. If, for example, changes are made to any or all of signal sets 1132 and 1134, or instrumentation logic 1110 and 1126, these changes would have to be accurately repeated in the instrumentation entity logic for the combined event.

The present invention provides a mechanism whereby events, such as events 1108 and 1124, are directly referenced and utilized as inputs to cross-hierarchical instrumentation entities. In this manner, signal connections 1132 and 1134, as well as instrumentation logic 1110 and 1126, are directly re-utilized to produce the desired hierarchical event.

To facilitate direct referencing of events within simulation models, a specialized data structure is implemented within instrumentation entity input port map comment syntax. This data structure directly connects input ports of instrumentation entities to cross-hierarchical events within a simulation model.

For the embodiment depicted in FIG. 7A, an instrumentation entity 1150 is instantiated within top-level design entity 1130 to generate a hierarchical event 1156 that is some function of events 1108 and 1124. As illustrated in FIG. 7A, instrumentation entity 1150 includes a pair of inputs 1151 and 1152 that are directly connected to events 1124 and 1108, respectively, utilizing the augmented syntax described below. These input connections are logically combined using instrumentation logic 1154 to produce a With reference to FIG. 7B, there is depicted a set of input port mapping comments for performing cross-hierarchical processing of simulation model events in accordance with the teachings of the present invention. In what follows, it is assumed that events 1108 and 1124 are count events with event names event_1108 and event_1124, respectively, and that these events are connected to input ports event_1108_in and event_1124_in on instrumentation entity 1150. As depicted in FIG. 7B, a first input port mapping comment 1161 contains data for referencing event 1124 to input port event_1124_in. A second input port mapping comment 1162 contains data for referencing event 1108 to input port event_1108_in. It should be noted that each of input port mapping comments 1161 and 1162 includes a pre-pended non-conventional comment identifier, --!!, that is utilized by the HDL compiler (such as compiler 462 in FIG. 3D) to maintain the port mapping comments separate from the design.

To facilitate connection of a simulation event to an instrumentation entity input port, input port mapping comments 1161 and 1162 includes two distinct parts: an instance identifier and an event identifier. The instance identifier is a string built from instance names (in descending hierarchical order) of all design entities between and including the design entity containing the instrumentation entity of the cross-hierarchical event being defined (i.e., the highest level design entity for the cross-hierarchical event), and the design entity in which the event that is utilized in generating the cross-hierarchical event. If the design entity containing the hierarchical event is the same as the design entity containing the event to be connected to, the instance identifier is a null string. A pair of instance identifiers 1163 and 1164, within input port mapping comments 1161 and 1162, respectively, specify that events 1124 and 1108 originate from signals within design entity 1120 and 1104 respectively.

Input port mapping comments 1161 and 1162 further include event identifiers 1165 and 1166, that identify input simulation events in terms of local instrumentation entities 1122 and 1106, respectively. In accordance with the embodiment depicted in FIG. 7B, each event identifier is a string beginning with an open bracket ("[") character and ending with a closed bracket ("]") character. Between these brackets, three sub-strings, delineated by period (".") characters, comprise a data structure utilized to identify a specific event from which the cross-hierarchical event is defined. The first sub-string within an event identifier is the instance name of the instrumentation entity containing the event. The second sub-string is a string specifying the type of the event ("count", "fail", or "harvest"). Finally, the third sub-string is the event name of the given event as specified in the declaration comment for the event. Each event identifier string uniquely identifies a single event within a given design entity. As depicted in FIG. 7B, event identifier strings 1165 and 1166 identify events 1124 and 1108 respectively.

In accordance with an alternate embodiment of the present invention, the event identifier naming structure is modified slightly for events that are labeled in accordance with FIG. 6D (event names that do not include the instrumentation entity name). When an instrumentation identifier is absent from the extended event identifier, the event identifier string with an input port mapping comment includes two sub-strings: a string denoting the type of event to connect to; and a string providing the name of the event separated by a period (".") character. The instrumentation entity name is not required in this case since all events of a given type associated with a given design entity will have unique names. The model build tools of the present invention will automatically search all instrumentation entities associated with the design entity called out by the instance identifier to determine which instrumentation entity generates an event having the name and type provided in the event identifier string.

Referring to FIG. 7C, there is illustrated a set of data structures for performing hierarchical processing of simulation model events in accordance with a second embodiment of the present invention. In the depicted embodiment, a pair of input port mapping comments 1171 and 1172 employs a syntax compatible with the event naming data structure depicted in FIG. 6D.

Input port mapping comment 1171 connects event 1124 to input port event_1124_in on instrumentation entity 1150. Likewise, input port mapping comment 1172 connects event 1108 to input port event_1108_in on instrumentation entity 1150. By utilizing the augmented syntax of FIG. 7B or FIG. 7C, it is possible to create hierarchical events by connecting the inputs of instrumentation entities to events within the simulation model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 8A and 8B, the present invention further provides for a more flexible implementation of instrumentation logic in a more unstructured manner.

Figure 8A:
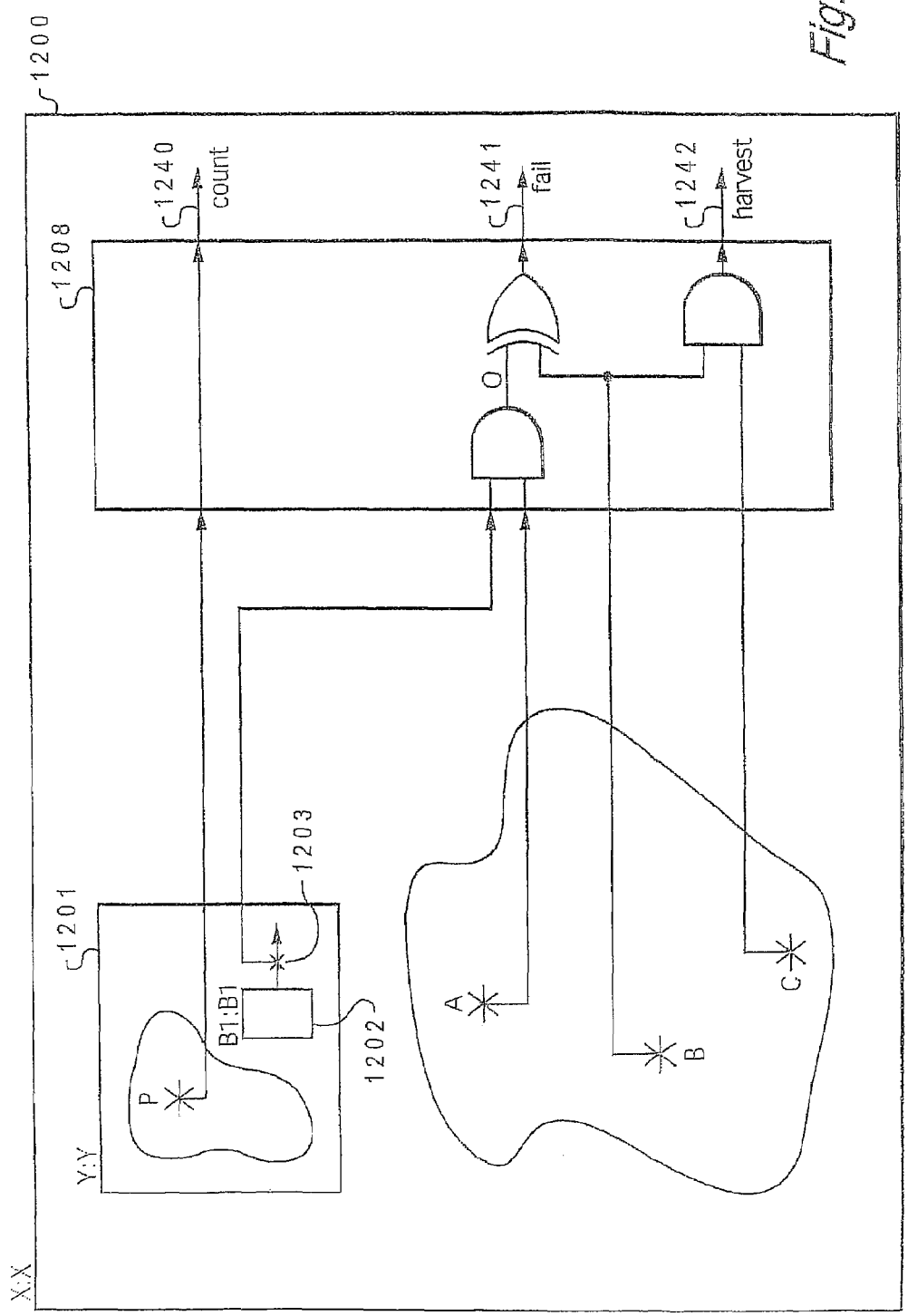
FIG. 8A depicts a representative target design entity with an instrumentation entity containing random instrumentation logic implemented in accordance with the teachings of the present invention.

It is often necessary to tailor instrumentation logic to address unique problems and circumstances. Instrumentation logic of a specific and yet non-predefined nature that is designed in accordance with the techniques disclosed herein with reference to FIGS. 8A and 8B is referred herein as "random instrumentation logic." A data construct including general logic primitives (Boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 8A and 8B, the present invention provides a method, system, and data structure for instrumenting design entities within a simulation model while avoiding the design process overhead required for creating a separate instrumentation entity HDL file.

In accordance with the teachings of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 8A, there is illustrated a representative target design entity 1200 wherein random instrumentation logic is implemented in accordance with a preferred embodiment of the present invention. Instantiated within target design entity 1200 is a design entity 1201. As further depicted in FIG. 8A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 8A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. HDL compiler 462 (FIG. 3B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities (described with reference to FIGS. 6A-6D) to generate instrumentation entity 1208.

A variety of possible syntaxes can be utilized to formulate the unconventional HDL comments required for generating random instrumentation logic within the source code file of a target design entity. As depicted in FIG. 8B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 8B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208. Comments 1223 are formulated as left-hand side (l.h.s.)/right-hand side (r.h.s.) assignment statements of the form:

$$\{l.h.s.\} <= \{r.h.s.\};$$

where {l.h.s.}, referred to herein after as lhs, is the assignment statement target and, {r.h.s}, referred to herein after as rhs is an expression denoting the logical value to be assigned to the statement lhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression with in bracket characters ("[A,A]") that generates a new event. Within comments 1223, a statement 1230 produces a count event 1240 from instrumentation entity 1208 (FIG. 8A) having eventname "countname0".

Within an lhs event declaration, a first field designates the event type (count, fail, harvest, etc.) and is followed by such other fields as are necessary to declare the event. As illustrated in lines 1230, 1234, and 1236, such event declaration fields follow the same format as the event declaration fields depicted in FIG. 3C.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 3D) during processing. Signals declared by an lhs expression may be incorporated within an rhs expression as shown in lines 1232 and 1234.

An rhs includes logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[", "]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be connections to signals within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y.[B1.count.count1]" connects instrumentation entity 1208 to instrumentation event 1203. This notation permits instrumentation events at any level of design hierarchy within target design entity 1200 to be directly accessed.

As further depicted in FIG. 8B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal B to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

The inclusion of instrumentation logic within a simulation executable model as described herein leads to an increase in the size of the simulation executable model and a concomitant increase in the time required to process a simulation run. With smaller simulation models, the decrease in simulation performance attributable to instrumentation logic is not significant. However, as larger simulation models are hierarchically constructed from smaller models, the simulation overhead attributable to the instrumentation logic can become significant. Accordingly, the present invention permits the processing overhead attributable to instrumentation logic to be reduced by selectively removing instrumentation events and associated logic elements from a simulation model prior to simulation.

Figure 9A:
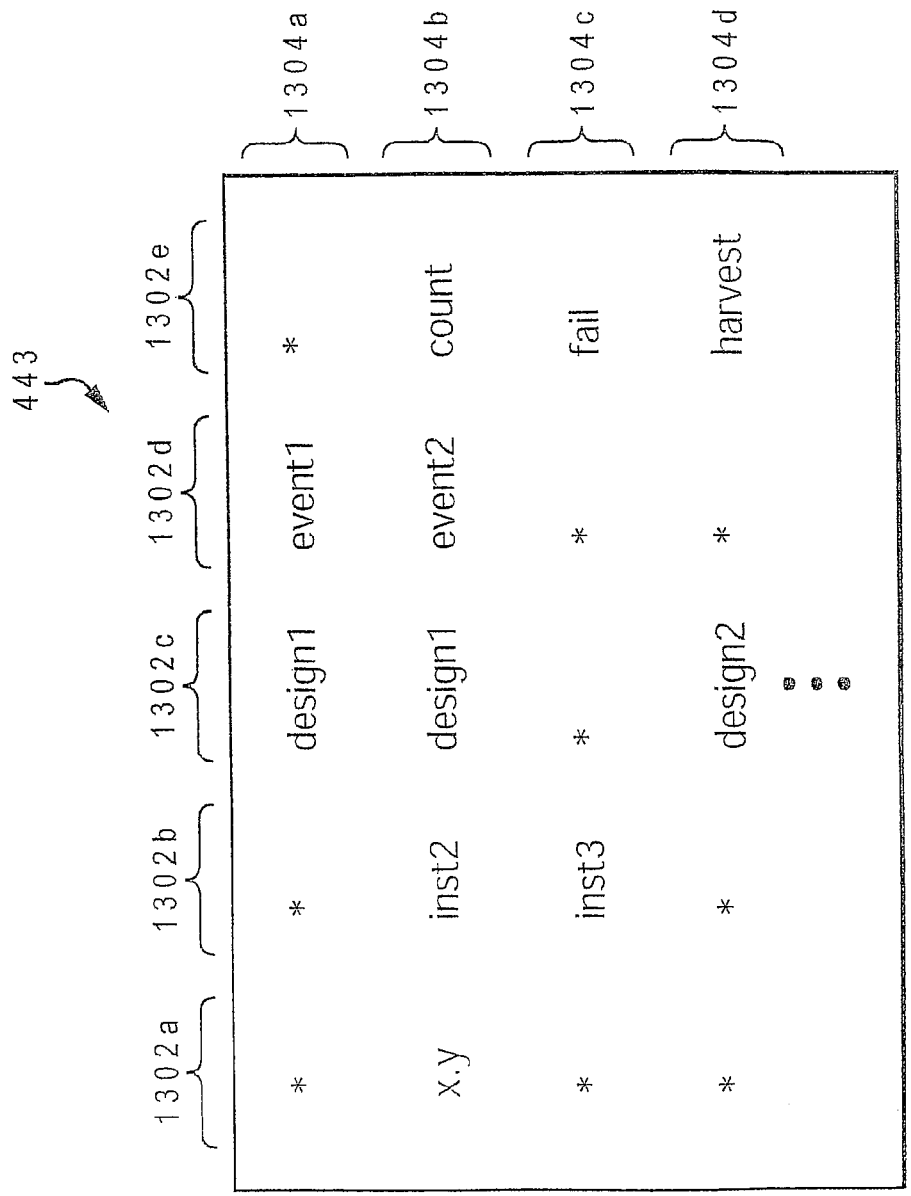
FIG. 9A depicts an exemplary embodiment of an exclusion file in accordance with the present invention.

To remove selected event instances and associated logic elements from the simulation model, a list of event instances that are to be removed from the simulation model are identified in an exclusion list, which may be provided, for example, in one or more exclusion files 443 (FIG. 3D). With reference now to FIG. 9A, there is illustrated an exemplary embodiment of an exclusion file 443 in accordance with the present invention. As shown, exclusion file 443 contains a plurality of entries 1304 including entries 1304a-1304d. Each of entries 1304 includes five fields 1302a-1302e, the first four of which respectively correspond to the instantiation identifier, instrumentation entity name, design entity name and eventname fields 1030-1036 of FIG. 6B (of course, entries 1304 may alternatively include fields corresponding to those illustrated in FIG. 6D). Field 1302e further indicates the type(s) of events (e.g., count, harvest, fail, etc.) identified by each entry 1304.

The information within fields 1302a-1302e identifies one or more events or event instances to be removed from the simulation model. For example, entry 1304a is intended to remove all instances of an event or events named "event1" associated with a design entity named "design1". Entry 1304b identifies for removal a specific instance of a count event named "event2" within the instrumentation entity "inst2" that is associated with the instance of design entity "design1" occurring at x.y in the model hierarchy. Entry 1304c is intended to remove all fail events associated with all instances of instrumentation entity "inst3". Finally, entry 1304d is intended to remove all harvest events associated with all instances of design entity "design2". Thus, exclusion file 443 permits a user, inter alia, to stipulate the removal of all instances of a particular instrumentation event, removal of one or more instances of an instrumentation event, removal of all instances of all events associated with instances of one or more instrumentation entities, or removal of all instances of all events associated with instances of one or more design entities.

Figure 9B:
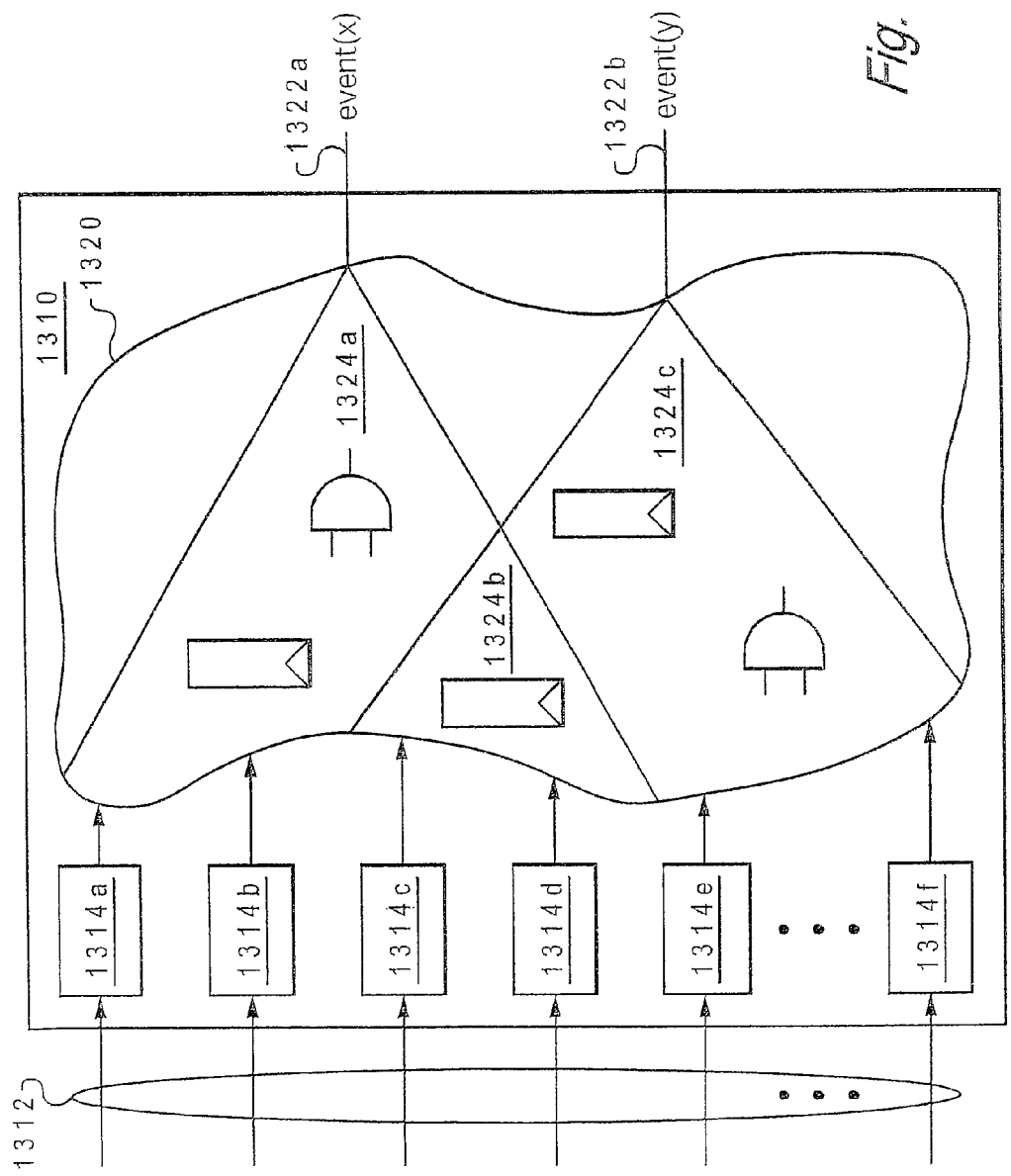
FIG. 9B is a block diagram of an exemplary instrumentation entity instance from which an instrumentation event and associated logic elements may be removed in accordance with the present invention.

Referring now to FIG. 9B, there is depicted an exemplary instrumentation entity 1310 from which an event instance and its associated logic may be selectively removed in accordance with the present invention. Instrumentation entity 1310 may be, for example, an instrumentation entity 409 (FIG. 3A) generated from an HDL instrumentation file 440 or an instrumentation entity 1208 (FIG. 8A) containing random instrumentation logic generated from statements 1223 embedded within an HDL design entity source code file 1220.

As depicted, instrumentation entity 1310 contains a number of boundary markers 1314a-1314f demarking the boundary between instrumentation entity 1310 and the input signals 1312 received from the target entity. Each boundary marker 1314 merely passes its input signal through to its output unaffected. Boundary markers 1314 are preferably inserted into each instrumentation entity proto data structure 466 by instrumentation load tool 464 or model preprocessor 445 prior to the flattening of the simulation model by model preprocessor 445. This implementation advantageously permits boundary markers 1314 to be applied to each instrumentation entity once. It will be appreciated that model preprocessor 445 may alternatively insert boundary markers 1314 during or after the process of flattening the simulation model through the creation of discrete instances of each instrumentation entity.

Instrumentation entity 1310 also includes a body section 1320 containing the logic that generates instrumentation event 1322a (event(x)) and instrumentation event 1322b (event(y)) from input signals 1312. In the exemplary embodiment, body section 1320 includes at least three regions: (1) region 1324a, which includes logic elements (including latches) that are utilized to generate only instrumentation event instance 1322a, (2) region 1324b, which contains logic elements that are utilized to generate both instrumentation event instances 1322a and 1322b, and (3) region 1324c, which includes logic that is utilized to generate only instrumentation event instance 1322b. Because of the dependency of instrumentation event 1322b on the logic within region 1324b, only the logic within region 1324a can be removed if instrumentation event 1322a is eliminated and instrumentation event 1322b is retained. Similarly, only the logic within region 1324c can be removed if instrumentation event 1322b is eliminated and instrumentation event 1322a is retained.

Figure 9C:
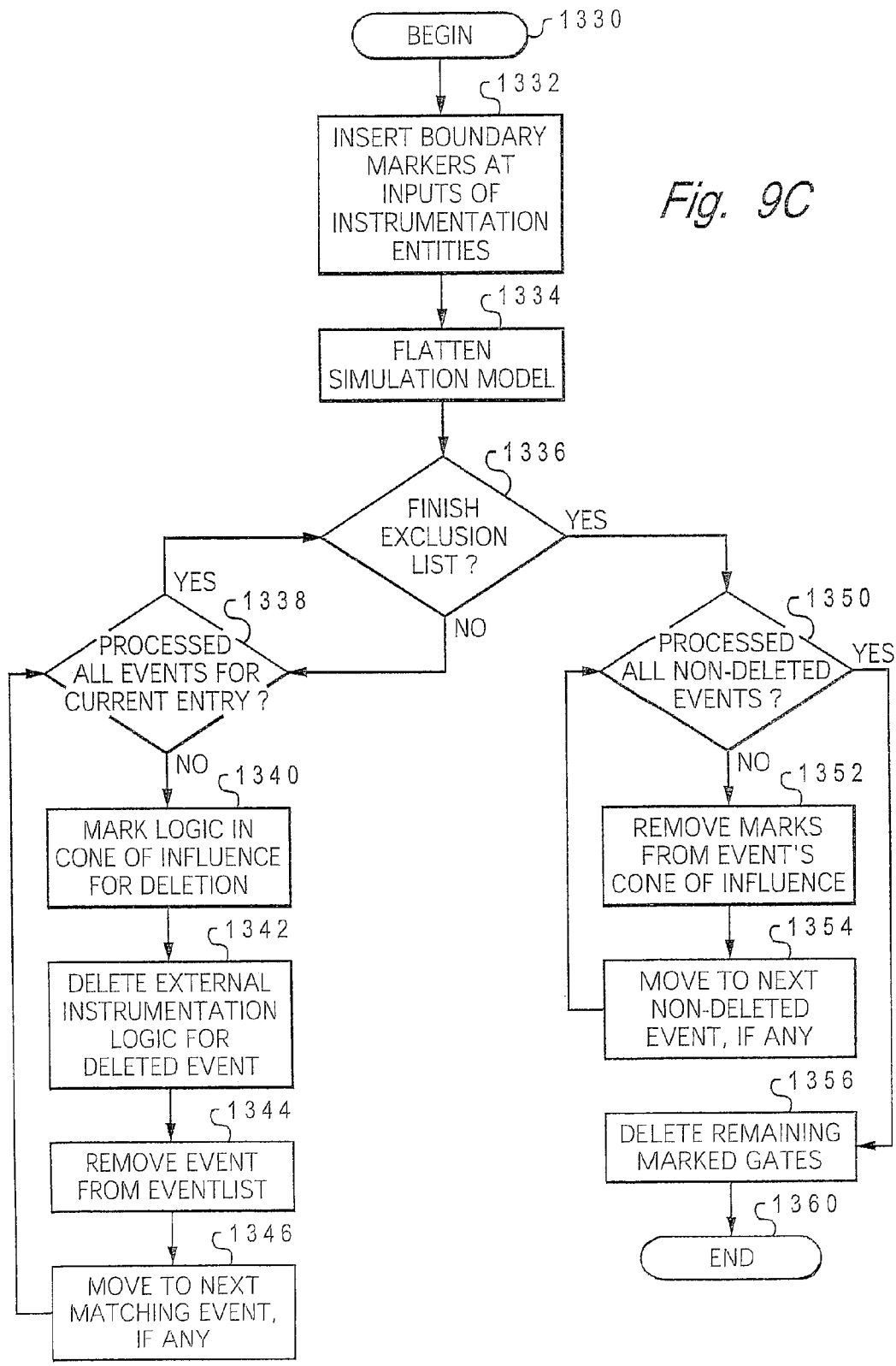
FIG. 9C is a high level logical flowchart of a first exemplary method of selectively removing instrumentation event instances and associated logic elements from a simulation model in accordance with the present invention.

With reference now to FIG. 9C, there is illustrated a high level logical flowchart of an exemplary method of selective removal of event instances and associated logic elements from a simulation model in accordance with the present invention. As a logical flowchart, some or all of the illustrated steps may be performed in an alternative order than that shown or in parallel. For clarity, FIG. 9C is described with specific reference to instrumentation entity 1310 of FIG. 9B. Further, it will be appreciated from the following description that the process is generally applicable to the removal from a simulation model of instrumentation event instances that do not depend upon other instrumentation event instances. In addition, although the depicted process assumes a single exclusion file 443, it will be appreciated that the process may be extended in a straightforward manner to support an exclusion list formed of multiple exclusion files 443 for a given simulation model.

The process begins at block 1330 and thereafter proceeds to blocks 1332 and 1334, which respectively illustrate instrumentation load tool 464 or model preprocessor 445 inserting boundary markers 1314 at the inputs of each instrumentation entity and model preprocessor 445 flattening the simulation model, as hereinbefore described. The process then proceeds to blocks 1336-1346, which depict model preprocessor 445 entering a processing loop in which model preprocessor 445 processes each entry 1304 in exclusion file 443. If model preprocessor 445 determines at block 1336 that it has processed every entry 1304 in exclusion file 443, the process passes to blocks 1350-1354, which are described below. If, however, model preprocessor 445 determines at block 1336 that one or more entries 1304 in exclusion file 443 remain to be processed, the process passes to block 1338.

Block 1338 depicts model preprocessor 445 determining if all instrumentation event instances identified by the entry 1304 of exclusion file 443 currently under consideration have been processed. If so, the process returns to block 1336; if not, the process proceeds to block 1340. At block 1340, model preprocessor 445 marks for deletion all logic elements (including latches) within the cone of influence of the next instrumentation event instance to be processed for the current entry 1304 in exclusion file 443. For example, if instrumentation event instance 1322a is identified for deletion by an entry 1304 in exclusion file 443, model preprocessor 445 marks for deletion all logic elements within region 1324a and 1324b of body 1320 beginning with instrumentation event instance 1322a and tracing backward through all signal paths through regions 1324a and 1324b until a boundary marker 1314 is found and marked. Stopping at a boundary marker 1314 ensures that logic within the target design entities is not marked for deletion and is therefore preserved. As further illustrated at blocks 1342 and 1344, model preprocessor 445 also deletes the external instrumentation logic (e.g., within external instrumentation logic 420 of FIG. 3B) for the identified instrumentation event instance and removes the instrumentation event instance from the event list for the simulation model. The process then advances to block 1346, which depicts model preprocessor 445 selecting for processing the next instrumentation event instance, if any, matching the criteria specified in the current entry 1304 of exclusion file 443. The process then returns to block 1338, which has been described.

In order to ensure that logic elements within a region (e.g., region 1324b of FIG. 9B) shared between a deleted instrumentation event instance and a non-deleted (retained) instrumentation event instance are retained, model preprocessor 445 enters a processing loop comprising blocks 1350-1354 in response to a determination at block 1336 that all entries 1304 of exclusion file 443 have been processed. Blocks 1350-1354 represent removing deletion marks from all logic elements shared between deleted and non-deleted event instances. Referring specifically to block 1350, model preprocessor 445 determines if all non-deleted event instances in the simulation model have been processed. If so, the process proceeds to block 1356, which is described below. If, however, at least one non-deleted event instance remains to be processed, the process passes to block 1352, which depicts removing deletion marks, if any, in the cone of influence of the non-deleted event instance. For example, if instrumentation event 1322b is a non-deleted event instance, model preprocessor 445 begins with instrumentation event instance 1322b and traces backward through each of its signal paths removing deletion marks, if any, until a boundary marker 1314 is reached. Thus, all deletion marks on logic elements within region 1324b of body 1320 are removed. Thereafter, the process proceeds to block 1354, which illustrates model preprocessor 445 advancing to the next non-deleted event instance to be processed, if any, within the simulation model. Thereafter, the process returns to block 1350, which has been described.

Block 1356 depicts model preprocessor 445 deleting (removing) from each instrumentation entity the logic elements, if any, that remain marked for deletion following the processing loop comprising blocks 1350-1354. For instrumentation entity 1310 of FIG. 9B, this includes all logic elements (e.g., gates and latches) within region 1324a. It will be appreciated by those skilled in the art that additional steps beyond the deletion of logic elements may need to be performed to support the removal of certain complex event types that may be defined. Such extensions are within the skill of those of ordinary skill in the art and are accordingly not discussed further herein. Following block 1356, the process of FIG. 9C ends at block 1360 having obtained a more compact simulation model.

As noted above, the above-described process is sufficient for the removal of instrumentation logic associated with instances of instrumentation events that do not themselves depend upon other instrumentation events. However, to additionally support the removal of instrumentation logic from simulation models in which simulation events are permitted to depend on other instrumentation events, some technique is required to ensure that instrumentation logic that is utilized to generate a non-deleted downstream instance of an instrumentation event is preserved. One such technique is illustrated in FIGS. 10A-10D and described in detail below.

Referring now to FIGS. 10A-10D, there is depicted a high level logical flowchart of an exemplary method of selectively removing instrumentation event instances and associated logic elements from a simulation model that permits instrumentation event instances to depend upon other simulation event instances. As a logical flowchart, it will be appreciated that some or all of the illustrated steps may be performed in an alternative order than that shown or in parallel. For clarity, FIGS. 10A-10D are described with specific reference to the instrumentation entities shown in FIGS. 11A-11D. It will further be appreciated from the following description that the process is generally applicable to the selective removal from a simulation model of instrumentation events and associated logic elements, even in cases in which one or more instrumentation event instances depend upon other instrumentation event instances. In addition, although the depicted process assumes a single exclusion file 443, it will be appreciated that the process may be extended in a straightforward manner to support an exclusion list formed of multiple exclusion files 443 for a given simulation model.

Figure 10A:
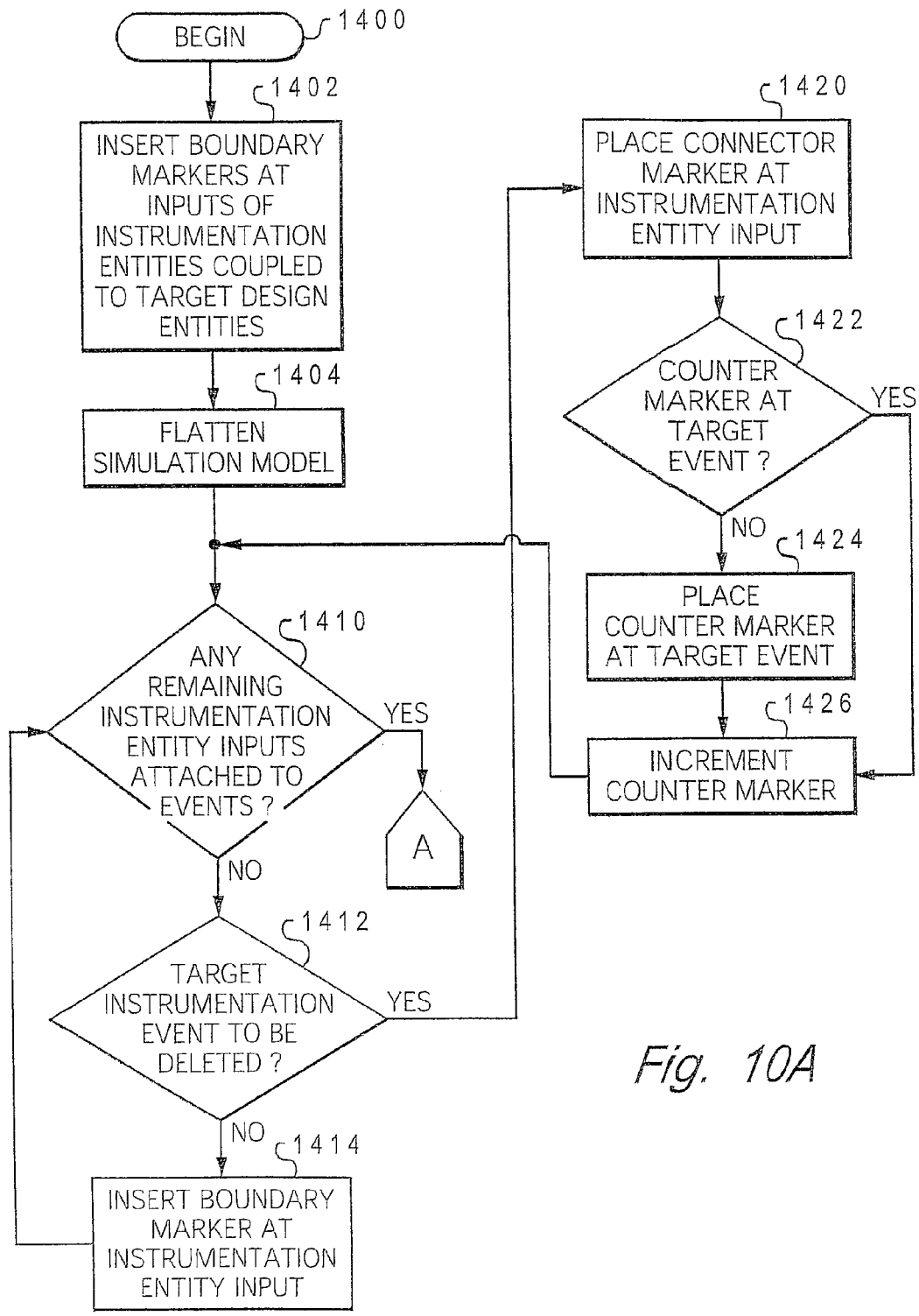
FIGS. 10A-10D together form a high level logical flowchart of a second exemplary method of selectively removing instrumentation event instances and associated logic elements from a simulation model in which instrumentation events may depend upon other instrumentation events in accordance with the present invention.
Figure 11A:
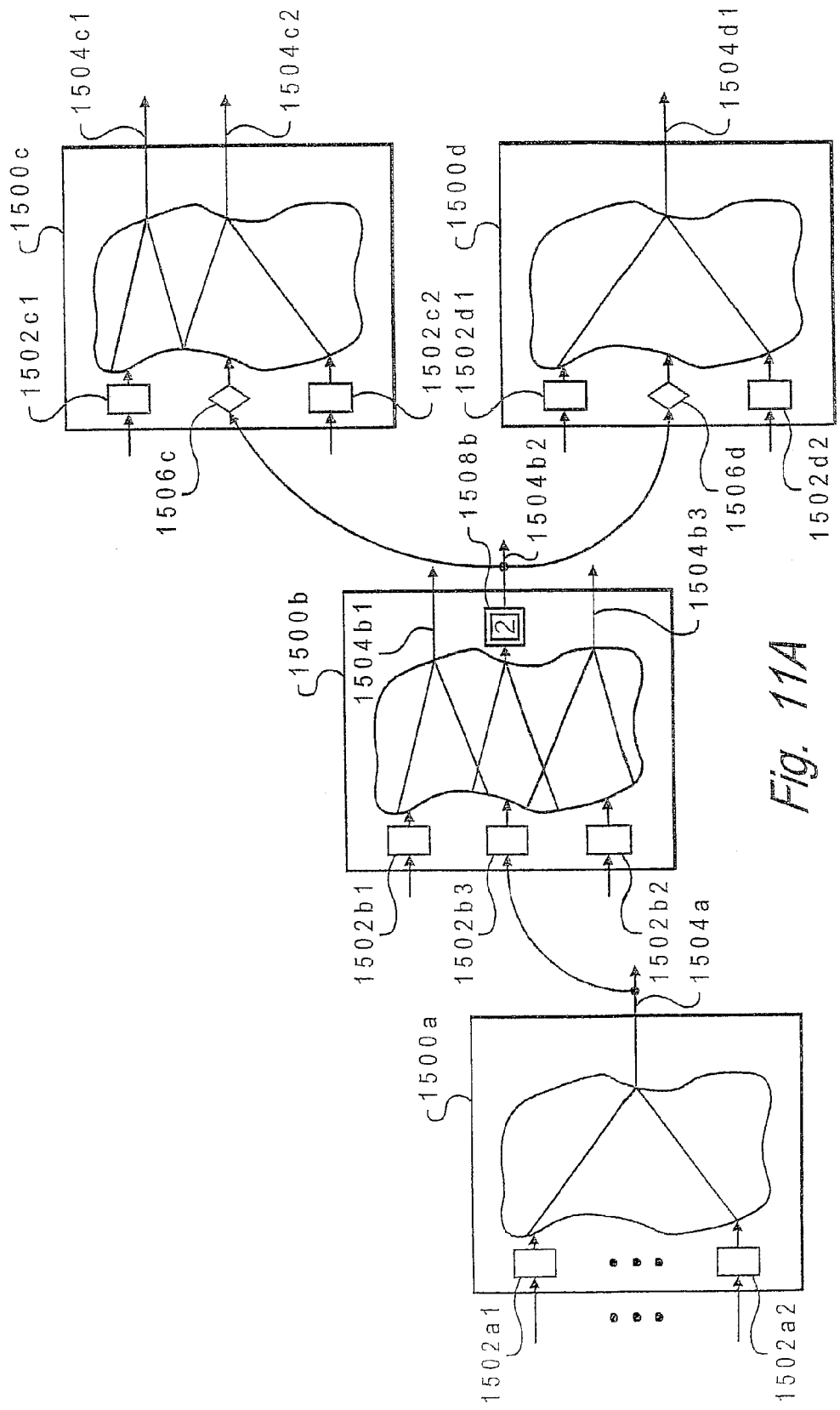

The depicted process begins at block 1400 of FIG. 10A and thereafter proceeds to block 1402, which illustrates instrumentation load tool 464 or model preprocessor 445 inserting a boundary marker at each instrumentation entity input coupled to a target design entity. For example, as shown in FIG. 11A, boundary markers 1502a1 and 1502a2 are inserted at inputs of instrumentation entity 1500a, boundary markers 1502b1 and 1502b2 are inserted at inputs of instrumentation entity 1500b, boundary markers 1502c1 and 1502c2 are inserted at inputs of instrumentation entity 1500c and boundary markers 1502d1 and 1502d2 are inserted at inputs of instrumentation entity 1500d. As further shown at block 1404, model preprocessor 445 flattens the simulation model in the manner hereinbefore described.

The process then proceeds to block 1410, which depicts model preprocessor 445 entering a processing loop in which model preprocessor 445 processes the remaining instrumentation entity inputs. In particular, model preprocessor 445 determines at block 1410 whether or not there is at least one additional instrumentation entity input to be processed that is attached to an instance of an instrumentation event. If not, the process proceeds through page connector A to FIG. 10B, which is described below. If, however, at least one additional instrumentation entity input that is attached to a target instrumentation event instance has not been processed, the process passes to block 1412. Block 1412 depicts model preprocessor 445 determining whether or not the target instrumentation event instance under consideration is identified within exclusion file 443 as an event instance to be deleted. If not, model preprocessor 445 inserts a boundary marker at the instrumentation entity input under consideration, as shown at block 1414. For example, as illustrated in FIG. 11A, model preprocessor 445 inserts boundary marker 1502b3 at the input of instrumentation entity 1500b connected to instrumentation event instance 1504a if exclusion file 443 does not identify that event instance for deletion. Thereafter, the process of FIG. 10A returns to block 1410, which has been described.

Returning to block 1412, if model preprocessor 445 determines that the target instrumentation event instance of the instrumentation entity input under consideration is identified for deletion within exclusion file 443, the process proceeds to block 1420. At block 1420, model preprocessor 445 places a connector marker (represented as a diamond in FIGS. 11A-11D) at the instrumentation entity input under consideration. Like boundary markers, connector markers contain no logic elements, but simply pass their inputs to their outputs. Assuming that instrumentation event instance 1504b2 of FIG. 11A is identified for deletion within exclusion file 443, model preprocessor 445 inserts connector markers 1506c and 1506d at the inputs of instrumentation entity 1500c and 1500d, respectively, that are connected to instrumentation event instance 1504b2.

Model preprocessor 445 next determines at block 1422 whether or not a counter marker is present at the target instrumentation event instance to which the instrumentation entity input under consideration is connected. Counter markers, like boundary and connector markers, do not contain any logic that modifies the signals to which they are connected. A counter marker merely indicates the number of downstream instrumentation entity inputs directly connected to the instrumentation event instance to which the counter marker is itself connected. If model preprocessor 445 determines at block 1422 that a counter marker is present at the target instrumentation event instance, model preprocessor 445 increments the count value of the counter marker, as illustrated at block 1426. Thereafter, the process returns to block 1410, which has been described. If, on the other hand, model preprocessor 445 determines at block 1422 that no counter marker is present at the target instrumentation event instance, as is the case when a particular instrumentation event instance is first encountered, model preprocessor 445 inserts a counter marker at the output of the target instrumentation event instance connected to the instrumentation event instance under consideration, as shown at block 1424. Model preprocessor 445 then increments the count value of the counter marker established at block 1424 to a count value of 1, as depicted at block 1426. Thereafter, the process returns to block 1410, which has been described.

In the example of FIG. 11A, the operations depicted at block 1420-1426 of FIG. 10A result in the insertion of counter marker 1508b at the output of instrumentation entity instance 1500b, which is connected to instrumentation event instance 1504b2. Counter marker 1508b ultimately has a count value of 2 based upon the connection of inputs of instrumentation entities 1500c and 1500d to target instrumentation event instance 1504b2.

Figure 10B:
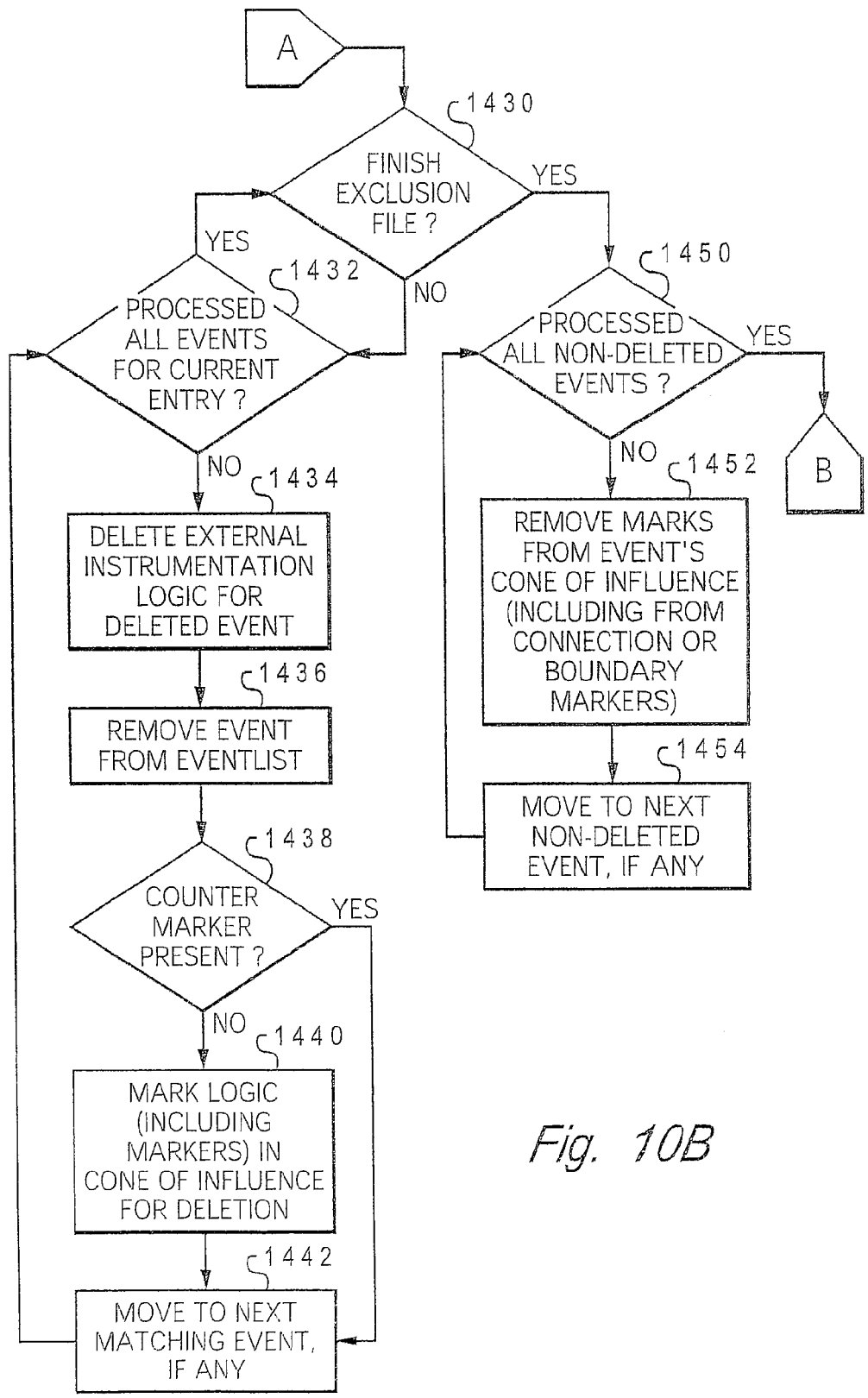

Referring now to FIG. 10B, the process begins at page connector A and then proceeds to blocks 1430-1442, which depict model preprocessor 445 entering a processing loop in which model preprocessor 445 processes each entry 1304 in exclusion file 443. If model preprocessor 445 determines at block 1430 that it has processed every entry 1304 in exclusion file 443, the process passes to blocks 1450-1454, which are described below. If, however, model preprocessor 445 determines at block 1430 that one or more entries 1304 in exclusion file 443 remain to be processed, the process passes to block 1432.

Block 1432 depicts model preprocessor 445 determining if all instrumentation event instances identified by the entry 1304 of exclusion file 443 currently under consideration have been processed. If so, the process returns to block 1430; if not, the process proceeds to blocks 1434 and 1436. At block 1434, model preprocessor 445 deletes the external instrumentation logic (e.g., within external instrumentation logic 420 of FIG. 3B) for the next instrumentation event instance to be removed and, at block 1436, removes the instrumentation event instance from the event list for the simulation model. Model preprocessor 445 further determines at block 1438 whether the logic elements in the instrumentation entity that are utilized to generate the removed instrumentation event instance can be marked for deletion. In the depicted embodiment, model preprocessor 445 makes this determination based upon whether the removed instrumentation event instance has an associated counter marker. If so, at least one downstream instrumentation event instance still depends upon the logic elements that generate the removed instrumentation event instance, and the logic elements therefore cannot be marked for deletion. The process accordingly passes to block 1442. If model preprocessor 445 determines at block 1438 that no counter marker is present at the removed instrumentation event instance, the process proceeds to block 1440. Block 1440 depicts model preprocessor 445 marking for deletion all logic elements (including latches) within the cone of influence of the removed instrumentation event instance up to and including any boundary or connector markers of the instrumentation entity. The process then advances to block 1442, which depicts model preprocessor 445 selecting for processing the next instrumentation event instance, if any, matching the criteria specified in the current entry 1304 of exclusion file 443. The process then returns to block 1432, which has been described.

Returning to block 1430, if model preprocessor 445 determines that it has processed every entry 1304 in exclusion file 443, the process passes to blocks 1450-1454. Blocks 1450-1454 represent removing deletion marks from all logic elements shared between deleted and non-deleted instrumentation event instances. Referring specifically to block 1450, model preprocessor 445 determines if all non-deleted event instances in the simulation model have been processed. If so, the process proceeds through page connector B to block 1460 of FIG. 10C, which is described below. If, however, at least one non-deleted instrumentation event instance remains to be processed, the process passes to block 1452, which depicts model preprocessor 445 removing deletion marks, if any, in the cone of influence of the non-deleted instrumentation event instance. The removal process includes the removal of deletion marks, if any, from connection and boundary markers. Thereafter, the process proceeds to block 1454, which illustrates model preprocessor 445 advancing to the next non-deleted instrumentation event instance to be processed, if any, within the simulation model. Thereafter, the process returns to block 1450, which has been described.

Figure 10C:
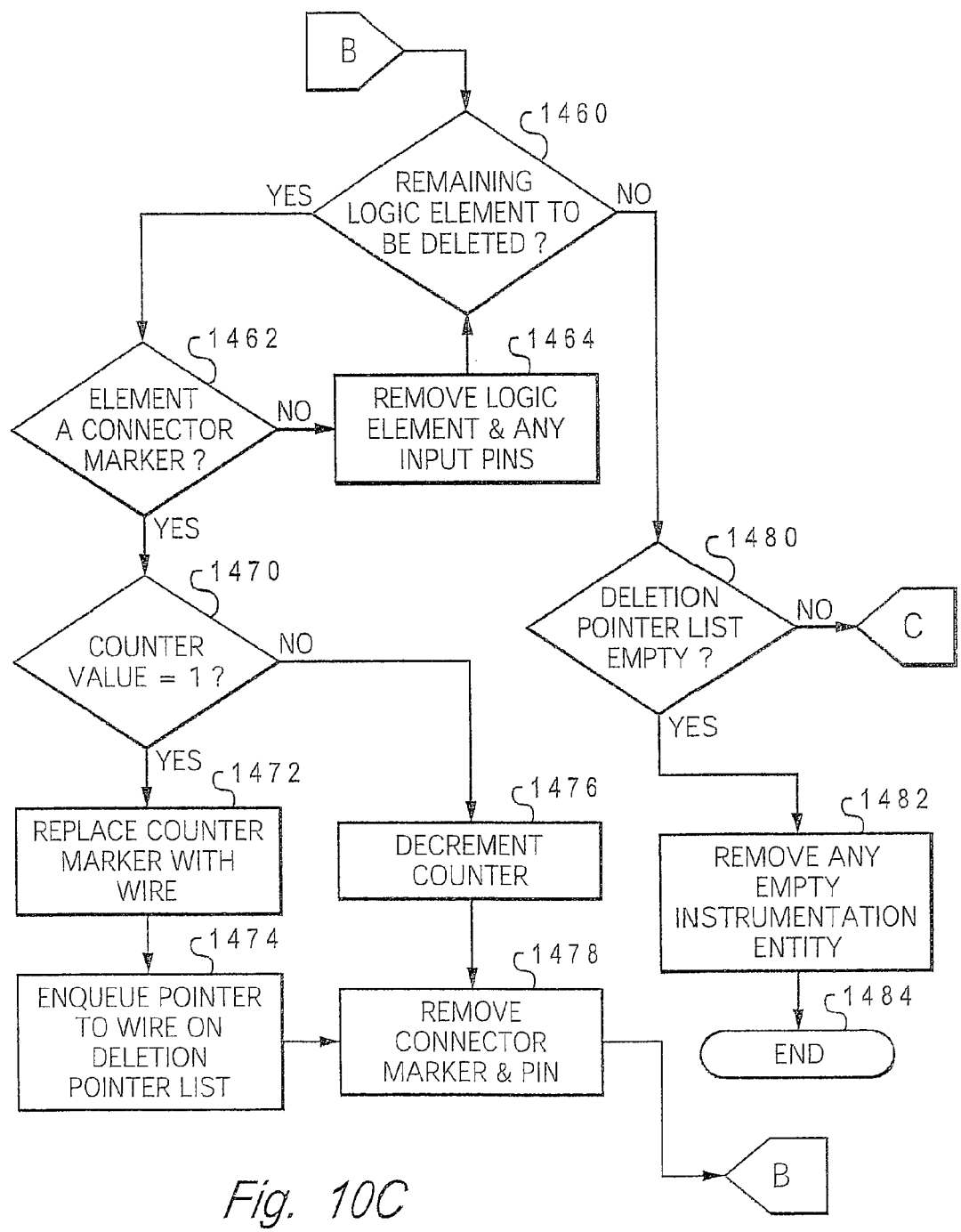
Figure 10D:
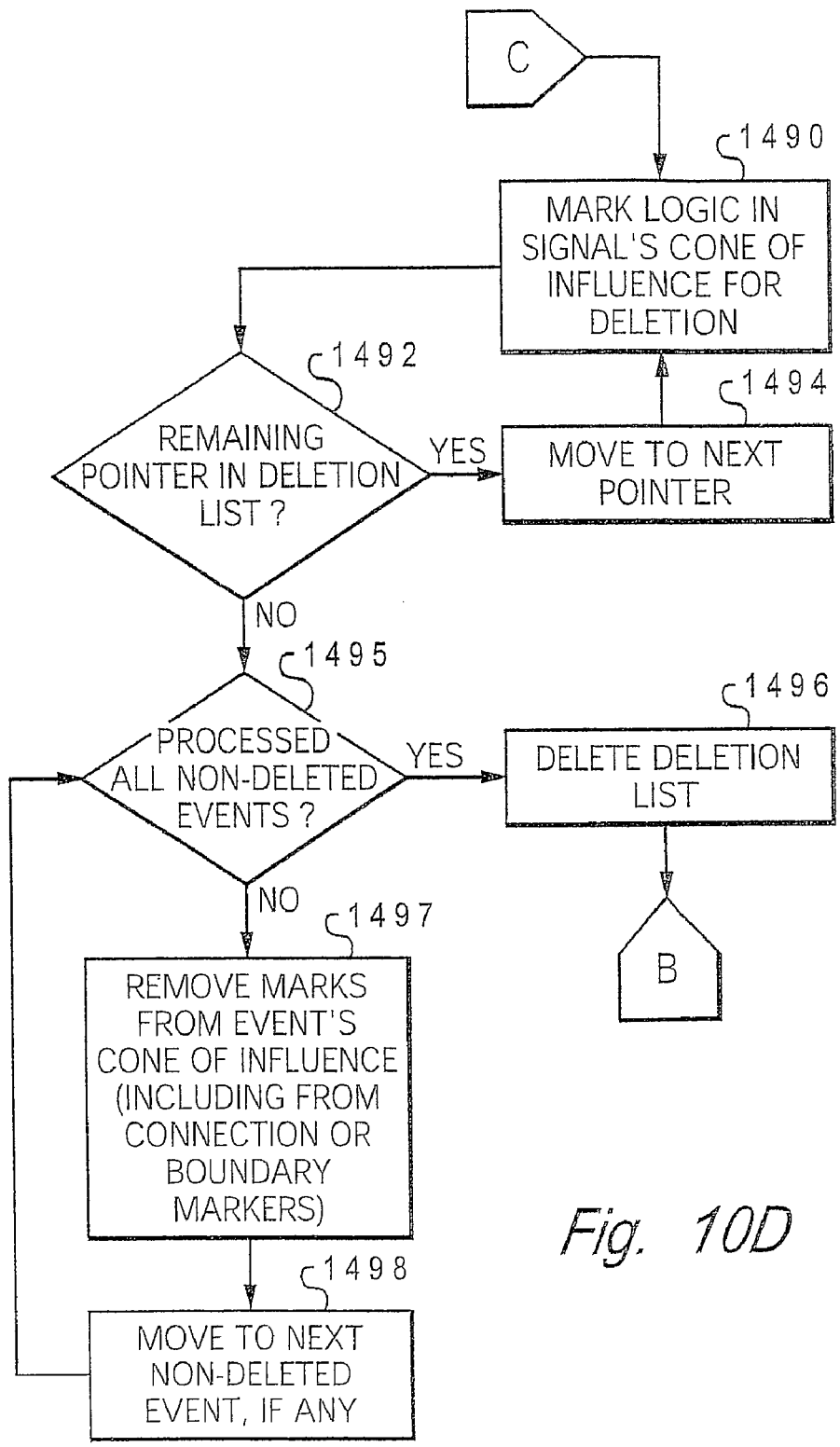

With reference now to block 1460 of FIG. 10C, the process then enters a processing loop in which logic elements marked for deletion are progressively removed from the simulation model as dependencies between instrumentation event instances are eliminated. At block 1460, model preprocessor 445 determines whether any logic elements that are marked for deletion remain in the simulation model. If not, the process passes to block 1480, which is described below. If, however, model preprocessor 445 determines at block 1460 that at least one logic element marked for deletion remains in the simulation model, the process proceeds to block 1462, which illustrates model preprocessor 445 making a further determination if the next logic element marked for deletion is a connector marker. If not, model preprocessor 445 removes from the simulation model the logic element under consideration and its input pins, if any. The process then returns to block 1460.

Returning to block 1462, in response to model preprocessor 445 determining that the logic element marked for deletion is a connector marker, model preprocessor 445 determines at block 1470 if the count value of the associated counter marker is equal to 1. If not, model preprocessor 445 decrements the count value of the associated counter marker 1508, as shown at block 1476. In addition, model preprocessor 445 removes the connector marker 1506 and its associated input pin. Thereafter, the process returns to block 1460, which has been described.

Figure 11B:
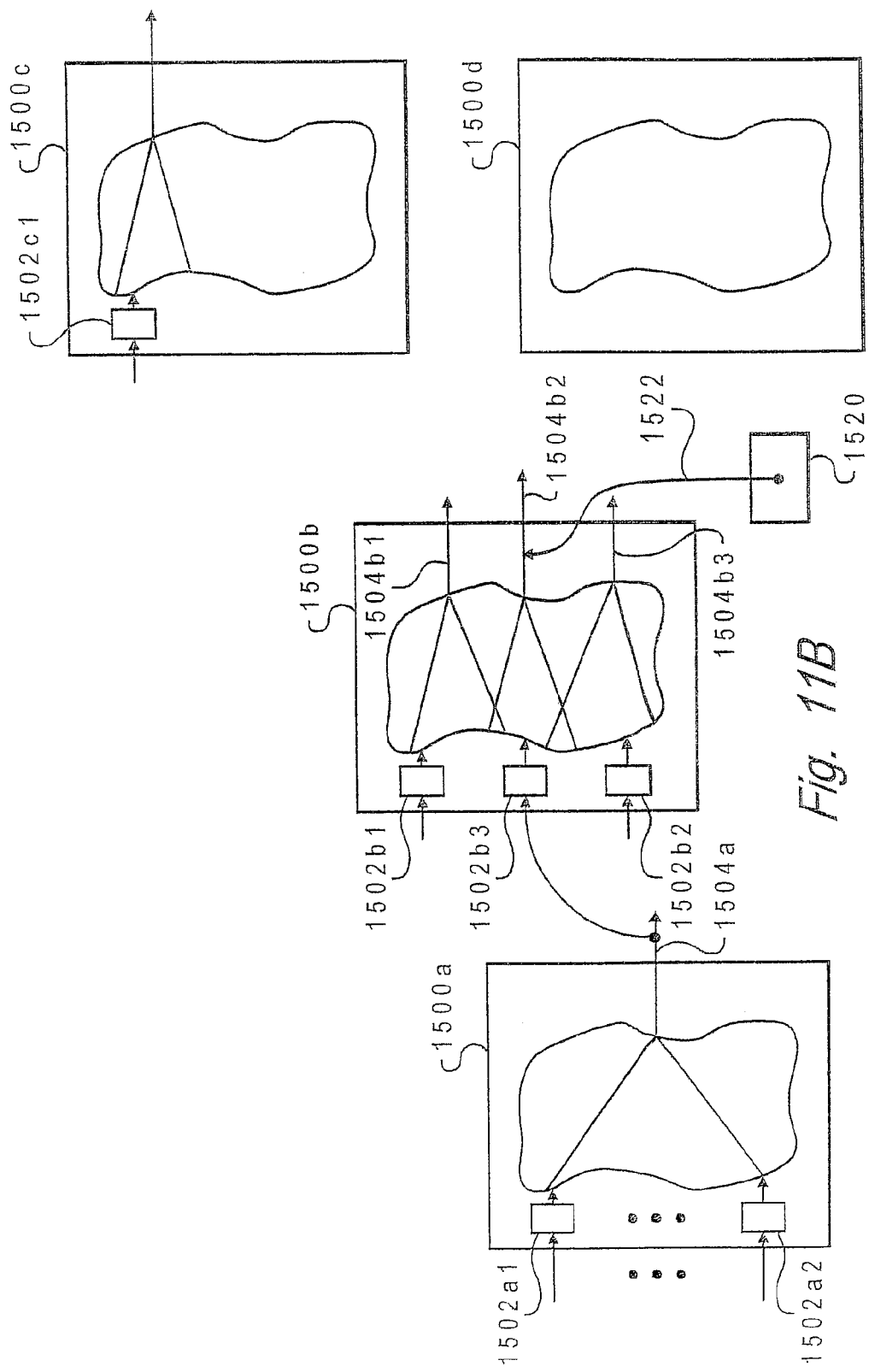

Returning to block 1470, if the count value of the counter marker 1508 associated with the connector marker 1506 marked for deletion is equal to 1, model preprocessor 445 replaces the counter marker 1508 with a representation of a wire (block 1472) and enqueues a deletion pointer to that wire within a deletion pointer list. Thereafter, the process proceeds to block 1478, which has been described. For example, FIG. 11B depicts an exemplary scenario in which instrumentation event instances 1504c2 and 1504d1 and their respective associated logic elements have been removed from the simulation model, counter marker 1508b has been replaced with a wire in accordance with block 1472, and a deletion list 1520 containing a deletion pointer 1522 identifying the replacement wire has been created. Deletion pointer 1522 identifies the wire and its associated logic elements for deletion in a subsequent pass of the process beginning at block 1480, which is described below.

Referring now to block 1480, model preprocessor 445 determines whether or not the deletion pointer list (e.g., deletion pointer list 1520 of FIG. 11B) is empty. If not, the process passes through page connector C to blocks 1490-1494 of FIG. 10D, which represent model preprocessor 445 entering a processing loop in which model preprocessor 445 marks logic elements within selected instrumentation entity instances for deletion by reference to deletion pointer list 1520. In particular, at block 1490 model preprocessor 445 selects a first or next deletion pointer 1522 from deletion pointer list 1520 and marks for deletion all logic elements of the instrumentation entity that are within the cone of influence of the signal (wire) identified by the deletion pointer 1522. As indicated at blocks 1492 and 1494, this process continues until all deletion pointers 1522 within deletion pointer list 1520 have been processed.

In response to model preprocessor 445 determining at block 1492 that deletion pointers 1522 within deletion pointer list 1520 have been processed, model preprocessor 445 then enters another processing loop comprising blocks 1495, 1497 and 1498 in which model preprocessor 445 removes the deletion marks associated with logic elements utilized to generate non-deleted instrumentation event instances. In particular, at block 1495 model preprocessor 445 determines if all non-deleted event instances in the simulation model have been processed. If so, model preprocessor 445 deletes deletion pointer list 1520, as shown at block 1496, and the process proceeds through page connector B to block 1460 of FIG. 10C, which has been described. If, however, at least one non-deleted instrumentation event instance remains to be processed, the process passes to block 1497, which depicts model preprocessor 445 removing deletion marks, if any, in the cone of influence of the non-deleted instrumentation event instance. The removal process includes the removal of deletion marks, if any, from connection and boundary markers. Thereafter, the process proceeds to block 1498, which illustrates model preprocessor 445 advancing to the next non-deleted instrumentation event instance to be processed, if any, within the simulation model. Thereafter, the process returns to block 1495, which has been described.

As depicted in FIG. 11C, the process steps shown at blocs 1480-1498 remove the wire identified by deletion pointer 1522 and all logic elements within its cone of influence (up to and including boundary marker 1502b3) that do not also fall within the cone of influence of non-deleted instrumentation event instances 1504b1 and 1504b3. In addition, deletion pointer list 1520 is deleted, as described with respect to block 1496.

Figure 11D:
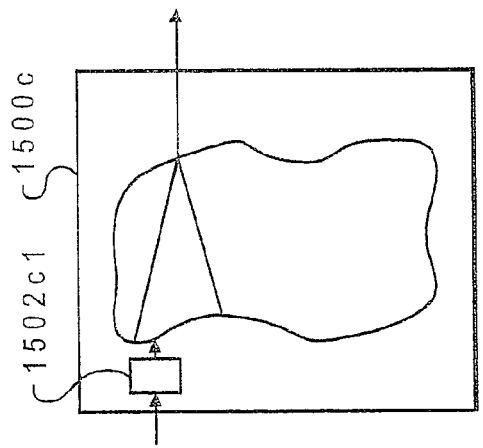
Figure 11D:
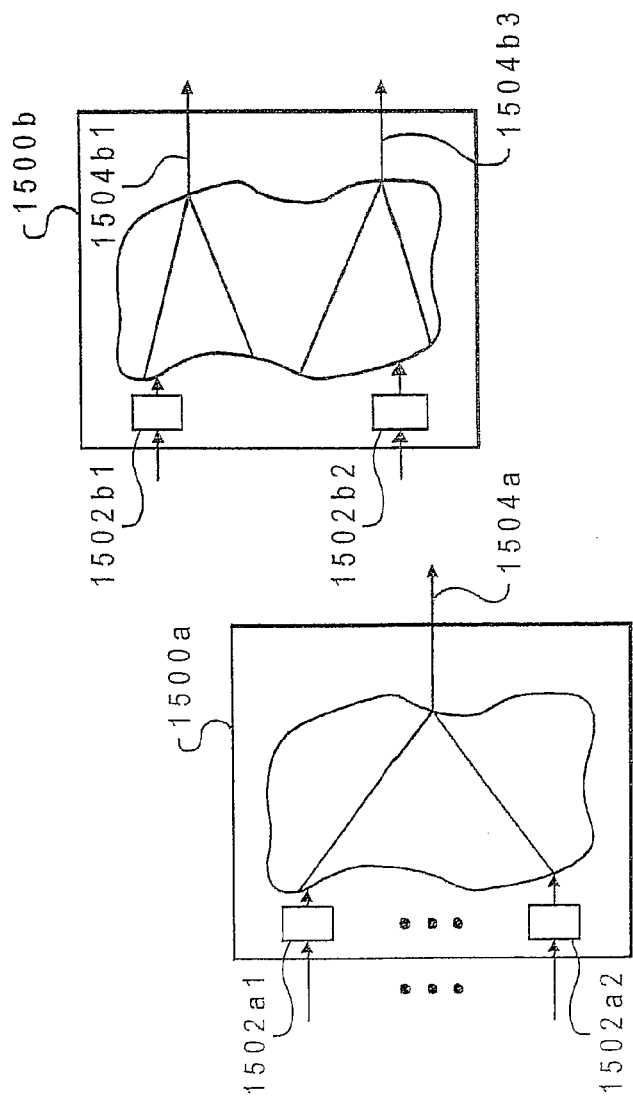

Returning to block 1480 of FIG. 1C, if model preprocessor 445 determines that the deletion pointer list 1520 is empty, meaning that no additional logic elements can be removed from the simulation model, model preprocessor 445 scans the simulation model for empty instrumentation entity instances containing no logic elements (block 1482). Any such "empty" instrumentation entity instances are deleted to further compact the simulation model. For example, FIG. 11D illustrates the deletion of instrumentation entity instance 1500d. Thereafter, the process ends at block 1484.

It will be appreciated by those skilled in the art that the iterative process of removing instrumentation logic shown in FIGS. 10A-10D is but one possible method of observing hierarchical dependencies, if any, between instrumentation event instances while removing unnecessary instrumentation logic. For example, in alternative embodiments of the present invention, the observation of hierarchical dependencies of instrumentation event instances, and hence the preservation of logic elements needed to generate downstream instrumentation event instances, may be implemented through the generation of a dependence graph indicating the dependence, if any, of downstream instrumentation event instances upon upstream instrumentation event instances.

As has been described, the present invention provides an improved data processing system and method of processing. According to the method, a simulation model is received that includes a plurality of design entity instances modeling a digital system and one or more instrumentation entity instances, separate from the plurality of design entity instances, that generate instances of instrumentation events for testing purposes during simulation. In response to receiving an exclusion list identifying at least one instance of one or more instrumentation events to be removed from the simulation model, the at least one instance of the one or more instrumentation events and associated logic elements are removed from the one or more instrumentation entity instances of the simulation model prior to simulation. In this manner, a more compact simulation model is obtained.

While the invention has been particularly shown as described with reference to a preferred embodiment, it will be understood by those skilled in the art that various changes in form and detail may be made therein without departing from the spirit and scope of the invention. For example, although aspects of the present invention have been described with respect to a computer system executing program code that directs the functions of the present invention, it should be understood that present invention may alternatively be implemented as a program product for use with a data processing system. Program code defining the functions of the present invention can be delivered to a data processing system via a variety of computer-usable or signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing or computer-usable media, when carrying or encoding computer readable instructions that direct the functions of the present invention, represent alternative embodiments of the present invention.

What is claimed is:

1. A computer-implemented method of processing in a data processing system, said method comprising:

receiving a simulation in a computer, said simulation model including a plurality of design entity instances modeling a digital system and one or more instrumentation entity instances, separate from said plurality of design entity instances, that generate instances of instrumentation events for testing purposes during simulation, wherein said one or more instrumentation entity instances include a first instrumentation entity instance having instances of first and second instrumentation events, said instance of said first instrumentation event having a first cone of influence and said instance of said second instrumentation event having a second cone of influence, and wherein both said first cone of influence of said instance of said first instrumentation event and said second cone of influence of said instance of said second instrumentation event include a shared logic element;

receiving an exclusion list identifying at least one said instance of the first instrumentation event to be removed from said simulation model, said exclusion list including no instance of the second instrumentation event;

marking for deletion logic elements of the instance of the first instrumentation event by tracing one or more signal paths backward from the instance of the first instrumentation event identified in said exclusion list to a boundary between said first instrumentation entity instance and a target design entity instance among said plurality of design entity instances;

removing deletion mark from said shared logic element;

removing said at least one said instance of said first instrumentation event identified in said exclusion list prior to simulation;

deleting from said first instrumentation entity instance each marked logic element in said first cone of influence of said instance of said first instrumentation event and retaining logic elements in said second cone of influence of said instance of said second instrumentation event prior to simulation, wherein said retaining comprises retaining said shared logic element;

deriving an instrumented simulation executable model from the simulation model following said deleting; and storing, in a storage medium, the instrumented simulation executable model.

* * * * *